(12) United States Patent
Childs

(10) Patent No.: US 9,501,080 B2
(45) Date of Patent: Nov. 22, 2016

(54) MULTIPLE OUTPUT OFFSET COMPARATOR

(71) Applicant: Dialog Semiconductor GmbH, Kirchheim/Teck-Nabern (DE)

(72) Inventor: Mark Childs, Swindon (GB)

(73) Assignee: Dialog Semiconductor (UK) Limited, Reading (GB)

( * ) Notice: Subject to any disclaimer, the term of this patent is extended or adjusted under 35 U.S.C. 154(b) by 221 days.

(21) Appl. No.: 14/262,986

(22) Filed: Apr. 28, 2014

(65) Prior Publication Data
US 2015/0301551 A1   Oct. 22, 2015

(30) Foreign Application Priority Data

Apr. 16, 2014  (EP) .................................... 14392003

(51) Int. Cl.
*G05F 3/26* (2006.01)
*H02M 3/156* (2006.01)
*H03K 5/24* (2006.01)
(Continued)

(52) U.S. Cl.
CPC .............. *G05F 3/267* (2013.01); *H02M 3/156* (2013.01); *H03K 5/2481* (2013.01); *G05F 3/26* (2013.01); *G05F 3/30* (2013.01); *H02M 3/158* (2013.01); *H02M 2001/0032* (2013.01); *Y02B 70/16* (2013.01)

(58) Field of Classification Search
CPC .............. G05F 3/02; G05F 3/08; G05F 3/10; G05F 3/16; G05F 3/20; G05F 3/22; G05F 3/222; G05F 3/227; G05F 3/24; G05F 3/242; G05F 3/247; G05F 3/26; G05F 3/262; G05F 3/265; G05F 3/267; H02M 3/156–3/158; H03K 5/22; H03K 5/24; H03K 5/2472; H03K 5/2481

USPC ......................................... 323/304, 311–313
See application file for complete search history.

(56) References Cited

U.S. PATENT DOCUMENTS 5,793,193 A   8/1998 Hodgins
5,963,062 A   10/1999 Fujii
(Continued)

FOREIGN PATENT DOCUMENTS

EP   1 835 603   9/2007
WO   WO 95/22853   8/1995

OTHER PUBLICATIONS

"A Fully Programmable Analog Window Conparator," by Rui Xiao et al., 2007, IEEE, 1-4244-0921-7/07, May 27, 2007, pp. 3872-3875.

(Continued)

*Primary Examiner* — Jessica Han
*Assistant Examiner* — David A. Singh
(74) *Attorney, Agent, or Firm* — Saile Ackerman LLC; Stephen B. Ackerman; Billy Knowles

(57) ABSTRACT

A multiple output comparator compares a first input signal and a second input signal. An output mirror circuit receives the comparison and sets an output signal at a first output terminal of the multiple output comparator to a digital state indicating that the magnitude of the is greater than or lesser than the second signal. An offset generator creates an offset signal for adjusting a threshold signal level at the output mirror circuit such that the difference of the and the second signal is combined with the offset signal. The output mirror circuit transfers provides a digital state to another output terminal indicating that the is greater than or lesser than the second signal as adjusted by the adjustment signal.

63 Claims, 8 Drawing Sheets

(51) Int. Cl.
  *G05F 3/30* (2006.01)
  *H02M 3/158* (2006.01)
  *H02M 1/00* (2006.01)

(56) References Cited

U.S. PATENT DOCUMENTS

| | | | | |
|---|---|---|---|---|
| 6,064,240 | A * | 5/2000 | Wachter | H03F 3/45076 29/407.04 |
| 6,232,844 | B1 * | 5/2001 | Talaga, Jr. | H03B 27/00 331/172 |
| 7,038,499 | B1 * | 5/2006 | Toosky | H03G 3/34 327/78 |
| 7,292,083 | B1 * | 11/2007 | Wang | H03K 5/2472 327/205 |
| 7,595,676 | B2 | 9/2009 | Trifonov | |

OTHER PUBLICATIONS

"Design of a Window Comparator with Adaptive Error Threshold for Online Testing Applications," by Amit Laknaur et al., Proceeding of the 8th International Symposium on Quality Electronic Design (ISQED'07), Mar. 26, 2007, 6 pgs.

European Search Report 14392003.1-1809, Nov. 4, 2014, Dialog Semiconductor GmbH.

\* cited by examiner

MULTIPLE OUTPUT OFFSET COMPARATOR

TECHNICAL FIELD

This disclosure relates generally to a semiconductor integrated circuit. In particular, this disclosure relates to a multiple output offset comparator circuit suitable for the semiconductor integrated circuit. More particularly, this disclosure relates to a multiple output offset comparator circuit for use in a buck DC-to-DC converter.

BACKGROUND

In applications where a single voltage signal is to be compared with multiple thresholds, (i.e. an "n-bit" analog-to-digital converter), the input signal is applied to multiple operational amplifiers structured as comparator circuits. Each of the operational amplifiers has a separate threshold voltage applied to the input of the operational amplifiers.

Another application for using a signal voltage signal compared with two threshold values is in a buck DC-to-DC converter. The comparator compares the output voltage of the buck DC-to-DC converter with a reference voltage and determines if additional current needs to be applied to an inductor in the circuit as is known in the art. The switching frequency of the current to the inductor or from the inductor are generally fixed with the duty cycle of the switching frequency being adjusted or pulse width modulated to determine the amount of current flowing into the inductor and thus to the load circuit connected the output terminal of the DC-to-DC converter.

Generally, buck DC-to-DC converters operate in one of two different modes, a continuous mode and a discontinuous mode. When the buck DC-to-DC converter is operating at light load (a small load current), the current supplied from the supply voltage source is not supplied on each cycle and the current then supplied from the collapsing field of the inductor. Instead of being a pulse width modulated (PWM) conversion process in the continuous mode, the conversion in now based on a pulse frequency modulation (PFM) in the discontinuous mode. Often the discontinuous mode is used in portable electronics such as smart cellular telephone, tablet computers, digital readers, etc. as a "sleep mode". The only current required by the system in these applications is monitoring current for system maintenance (i.e. system clocking and timers, cellular network monitoring, wireless network monitoring).

In the sleep mode, there are two different operating states. In the first state, the basic sleep state, a sleep comparator determines when the output voltage level of the buck DC-to-DC converter falls below a reference voltage level provided for the sleep comparator. When the output voltage level of the buck DC-to-DC converter has fallen below the reference voltage level, a PMOS transistor is activated to allow current to pass to an inductor of the buck DC-to-DC converter to increase the output voltage level appropriately.

In a second state of the sleep mode, a panic state, a panic comparator determines if the output voltage level of the buck DC-to-DC converter falls by a predetermine level below the reference voltage level (i.e. 10 mV). The panic comparator activates a panic signal and the panic comparator acts to change the drive scheme of the buck DC-to-DC converter to support a larger load current.

The sleep comparator is triggered regularly as part of the normal operation of the buck DC-to-DC converter. However, the buck DC-to-DC converter should only "panic" if the output voltage continues to fall. It is clearly important that these thresholds for the sleep comparator and the panic comparator are accurate, but it is more important that the gap between the thresholds is well controlled.

This situation occurs in many applications, where a lower threshold is used to trigger a corrective action, and a higher threshold is used as part of the normal operation. In these applications, the exact threshold of the comparators is less important than the difference between the two thresholds of the comparators.

SUMMARY

An object of this disclosure is to provide a comparator circuit that compares an input signal with multiple reference signal levels that are accurately offset from one another.

An object of this disclosure is to provide an integrated circuit that receives a feedback signal that is compared with multiple offset threshold signal levels to determine a level within a range of the offset threshold levels of the feedback signal.

To accomplish at least one of these objects, a multiple output comparator has a difference circuit that receives a first signal and a second signal to determine when a magnitude of the first signal is greater than or lesser than the second signal. The difference circuit provides an in-phase output signal and an out-of-phase output signal that are indicative that the magnitude of the first signal is greater than or lesser than the second signal.

The multiple output comparator has an output mirror circuit that receives the in-phase output signal and an out-of-phase output signal from the difference circuit to capture the indication that the magnitude of the first signal is greater than or lesser than the second signal and sets an output signal at a first output terminal of the multiple output comparator to a digital state indicating that the magnitude of the first signal is greater than or lesser than the second signal. The output mirror circuit includes an offset generator that creates an adjustment signal for adjusting a threshold signal level of the difference circuit such that the magnitude of the first signal is greater than or lesser than the second signal with an offset signal level added to or subtracted from a difference of the first signal and the second signal. The output mirror circuit transfers at least one output signal to at least one second output terminal of the multiple output comparator to a digital state indicating that the magnitude of the first signal is greater than or lesser than the second signal as adjusted by the adjustment signal.

The in-phase output signal from difference circuit is connected to a first mirror driver. The first mirror driver has a first mirror reference leg for developing an in-phase reference signal. The out-of-phase output signal from the difference signal is connected to a second mirror driver. The second mirror driver has a second mirror reference for developing an out-of-phase reference signal. The first mirror reference leg is connected to at least one in-phase mirror leg such that each in-phase mirror leg generates a mirrored in-phase signal. The second mirror reference leg is connected to at least one out-of-phase mirror leg such that each out-of-phase mirror leg generates a mirrored out-of-phase signal.

The first mirror driver and the second mirror driver is connected to a transfer mirror for transferring the mirrored in-phase signal to the second mirror driver for combining with the at least one mirrored out-of-phase signal for determining the digital state of the at least one out-of-phase mirror leg that is to be transferred to the at least one second output terminal of the multiple output comparator.

The transfer mirror has at least one transfer mirror reference leg connected to receive the at least one mirrored in-phase signal. The transfer mirror has at least one mirror transfer leg connected to an associated transfer mirror leg to transfer an at least one second mirrored in-phase signal to an associated out-of-phase mirror leg to be combined with the mirrored out-of-phase signal to determine the digital state at the at least one second output terminal of the multiple output comparator. The combination of the at least one second mirrored in-phase signal and the associated mirrored out-of-phase signal allows a dominant of the mirrored in-phase output signal and mirrored out-of-phase output signal to generate the digital state indicating that the magnitude of the first signal is greater than or lesser than the second signal. The digital state being applied the second output terminal of the comparator. The offset generator is selectively connected to the in-phase mirror legs and/or the out-of-phase mirror legs to modify the threshold of the comparison of the first input signal and the second input signal such that the magnitude of the first signal is greater than or lesser than the second signal additively combined with the offset signal.

In various embodiments of this disclosure the difference circuit has a pair of transistors of a first conductivity type connected as a differential amplifier. In embodiments where the transistors are metal oxide semiconductor (MOS) transistors, the sources are commonly connected together and to a first terminal of a current source. The second terminal of the current source is connected to reference supply voltage source. The first signal and the second signal are each connected to a gate of one of the pair of MOS transistors. The drains of the pair of MOS transistors of the first conductivity type are connected to form the output terminals of the difference circuit and are connected as the inputs to the output mirror circuit. The first mirror reference leg and second mirror reference leg are each formed of a diode connected MOS transistor of a second conductivity type with their gates and drains commonly connected through the output terminals of the difference circuit to the drains of the pair of transistors of the differential amplifier. The sources of the two diode connected MOS transistors are connected to a power supply voltage source.

The at least one in-phase mirror leg has a first MOS mirroring transistor for generating the mirrored in-phase output signal and the at least one out-of-phase mirror leg has a second MOS mirroring transistor for generating at least one mirrored out-of-phase output signal.

The transfer mirror reference leg within the at least one in-phase mirror leg has a diode connected MOS transistor of the first conductivity type having a gate and drain commonly connected with the source of the first MOS mirroring transistor and a source connected to the reference supply voltage source for transferring the mirrored in-phase output signal to the transfer mirror leg. The transfer mirror leg of the has a third MOS mirroring transistor having a gate connected to the gate and drain of the diode connected MOS transistor of the associated transfer mirror reference leg. A source of the third MOS mirroring transistor is connected to the reference supply voltage source. The drain of the third MOS mirroring transistor is connected with the source of the second MOS mirroring transistor for transferring the mirrored in-phase output signal to the associated out-of-phase mirror leg. The junction of the connection of the drain of the third MOS mirroring transistor and the second MOS mirroring transistor is a second output terminal of the comparator for transferring of the digital state to external circuitry.

In various embodiments, the offset generator is a current source that is selectively connected to the associated in-phase mirror legs and/or the out-of-phase mirror legs to modify the threshold of the comparison of the first input signal and the second input signal such that the magnitude of the first signal is greater than or lesser than the second signal additively combined with the offset signal. The injected current of the current source is proportional to the current through the pair of transistors of the differential amplifier to make the added offset very accurately controlled.

In some embodiments, the offset generator is connected in parallel with the out-of-phase mirroring leg. In other embodiments, the offset generator is connected in parallel with the transfer mirror leg. In still other embodiments, the offset generator is connected in parallel with the in-phase mirror leg. And in still other embodiment, the offset generator is connected in parallel with the transfer mirror reference leg. The current source of the offset generator may be programmable to adjust the threshold offset of the comparator a selected output. The current source is structured to be scalable to provide the adjustment of the threshold offset of the comparator at the selected second output terminal.

When the first signal is greater than the second signal, the at least one in-phase mirror legs of the mirror driver generates a larger output signal than the at least one out-of-phase mirror legs. Thus, the in-phase output signal of the difference circuit is larger than the out-of-phase output signal. The mirrored larger in-phase output signal is transferred to the at least one in-phase mirror legs and the mirrored smaller out-of-phase output signal is transferred to the at least one out-of-phase mirror legs. The larger in-phase output signal is transferred to the at least one out-of-phase mirror legs through the mirror transfer leg where it is combined with the smaller out-of-phase output signal and dominates the smaller out-of-phase output signal to cause the output of the comparator to assume the digital state representing that the first signal is greater than the second signal.

When the first signal is less than the second signal, the at least one in-phase mirror legs of the mirror driver generates a smaller output signal than the at least one out-of-phase mirror legs. Thus, the in-phase output signal of the difference circuit is less than the out-of-phase output circuit. The mirrored larger in-phase output signal is transferred to the at least one in-phase mirror legs and the mirrored smaller out-of-phase output signal is transferred to the at least one out-of-phase mirror legs. The smaller in-phase output signal is transferred to the at least one out-of-phase mirror legs through the mirror transfer leg where it is combined with the larger out-of-phase output signal where the larger out-of-phase output signal dominates to cause the output of the comparator to assume the digital state representing that the first signal is less than the second signal.

In various embodiments, the mirror driver includes a plurality of in-phase mirror legs and a plurality of out-of-phase mirror legs. Each of the in-phase mirror legs is coupled to one of the of the out-of-phase mirror legs. Each out-of-phase mirror leg providing an output terminal for the comparator providing multiple output signals. Each of the in-phase mirror legs and/or the out-of-phase mirror legs may selectively have one of the offset generator to adjust the threshold voltage of the comparator for the digital state present at the output of the out-of-phase mirror leg.

In various other embodiments, the mirror driver includes one in-phase mirror legs and a plurality of out-of-phase mirror legs. The in-phase mirror leg is coupled to each of the of the out-of-phase mirror legs. Each out-of-phase mirror leg providing an output terminal for the comparator providing multiple output signals.

In some embodiments, the mirror driver includes one in-phase mirror leg and one out-of-phase mirror leg. The in-phase mirror leg is coupled to one of the of the out-of-phase mirror leg. The out-of-phase mirror leg providing multiple output terminals for the comparator providing multiple output signals. Each output terminal is connected to a first terminal of a switch. A second terminal of the switch is connected to an input terminal of a buffer circuit. The output terminal of the buffer circuit is connected to one output of the comparator circuit. Each switch is activated successively to provide the digital state of the comparator to one of the output terminals.

The out-of-phase mirror leg has multiple offset generators to adjust the threshold voltage of the comparator for the digital state present at the output of the out-of-phase mirror leg. A first offset generator has a switch with a first terminal connected to the junction of the transfer mirror leg and the out-of-phase mirror leg. The remaining multiple offset generators have switches that are connected in series with the switch of the preceding offset generator. The second terminal of each switch of the multiple offset generators is connected to the current source of the offset generator. As each of the output terminals are selected, an additional current source of one of the offset generators is added to modify the threshold offset of the comparator to provide different threshold offsets for each of the output terminals of the comparator.

In various embodiments, at least one of the objects of this disclosure is accomplished by an integrated circuit such as a buck DC-to-DC converter that has multiple output comparator. The multiple output comparator is structured and functions as above. In the embodiments of the buck DC-to-DC converter, the comparator is structured to combine the functions of a sleep comparator and a panic comparator. The sleep comparator determines if a feedback signal indicating an output voltage level of the buck DC-to-DC converter is less than a reference signal. If feedback signal is less than the reference signal, the comparator sleep output is triggered. The panic comparator determines if the feedback signal is less than a panic threshold level of approximately 10 mV. When the feedback signal is greater than the panic threshold level of the reference signal, the panic output of the comparator is triggered. In various embodiments of this comparator for the buck DC-to-DC converter, the mirror driver of the comparator has an in-phase sleep mirror leg, an out-of-phase sleep mirror leg, an in-phase panic mirror leg, and an out-of-phase panic mirror leg. The offset generator current source is connected in parallel with the second out-of-phase MOS mirroring transistor to set the offset voltage level to be the panic threshold voltage level. In other embodiments, the mirror driver there is one in-phase mirror leg coupled to an out-of-phase sleep mirror leg and an out-of-phase panic mirror leg. In these embodiments, the offset generator current source is connected in parallel with the transfer mirror leg to set the offset voltage level to be the panic threshold voltage level. In still other embodiments, the mirror driver includes one in-phase mirror leg and one out-of-phase mirror leg. The in-phase mirror leg is coupled to one of the of the out-of-phase mirror leg. The out-of-phase mirror leg has a sleep output terminal and a panic output terminal. Each output terminal is connected to a first terminal of a switch. A second terminal of the switch is connected to an input terminal of a buffer circuit. The output terminal of the buffer circuit is connected to one output of the comparator circuit. Each switch is activated successively to provide the digital state of the comparator to one of the output terminals.

The out-of-phase mirror leg has an offset generator to adjust the threshold voltage of the comparator for the digital panic state present at the panic output terminal of the out-of-phase mirror leg. The offset generator has a switch with a first terminal connected to the junction of the transfer mirror leg and the out-of-phase mirror leg. The second terminal of the switch the offset generators is connected to a current source of the offset generator. As each of the first output terminal is selected, there is no offset for the threshold voltage of the comparator. When the second output terminal is selected, the current source of the offset generator is added to modify the threshold offset of the comparator to provide panic threshold offset level for the panic output terminal of the comparator.

DETAILED DESCRIPTION

In applications of the prior art such as the buck DC-to-DC converters described above, the comparators are implemented as separate blocks within the system. Each comparator therefore has a spread of threshold dominated by the mismatching of the characteristics of the input pair of transistors connected as a differential amplifier. In order to control how much variation in threshold occurs the comparators must be very carefully designed. In applications where a comparator is used to determine the existence of a fault condition, the mismatch in the input pair of transistors of the differential amplifiers of related comparators is greater than the separation in their thresholds, a problem may not be determined in time to provide necessary corrective action to prevent the fault from having a deleterious effect on the system.

In some circumstances, one signal is being measured by multiple comparators to determine when a potential issue is developing and needs to have attention from the system or to determine when a fault has occurred and corrective action is to be taken. The separation between the two thresholds of the two discrete comparators has to be set greater than would be ideal, because the mismatch in the comparators is too large. The mismatch is a result of the differences in the transistors resulting from tolerances in the processing. These tolerances effect the currents through the transistors and thus the differences in threshold voltages between the comparators. The offset voltage is proportional to the differences in the offset current and inversely proportional to the transconductance of the input differential pair of transistors of the comparators. This negatively impacts the operation of a system such as the buck DC-to-DC converter by affecting such parameters as the transient load regulation. In situations such as this, the exact threshold of each comparator is less important than the difference between the two thresholds.

Figure 1:
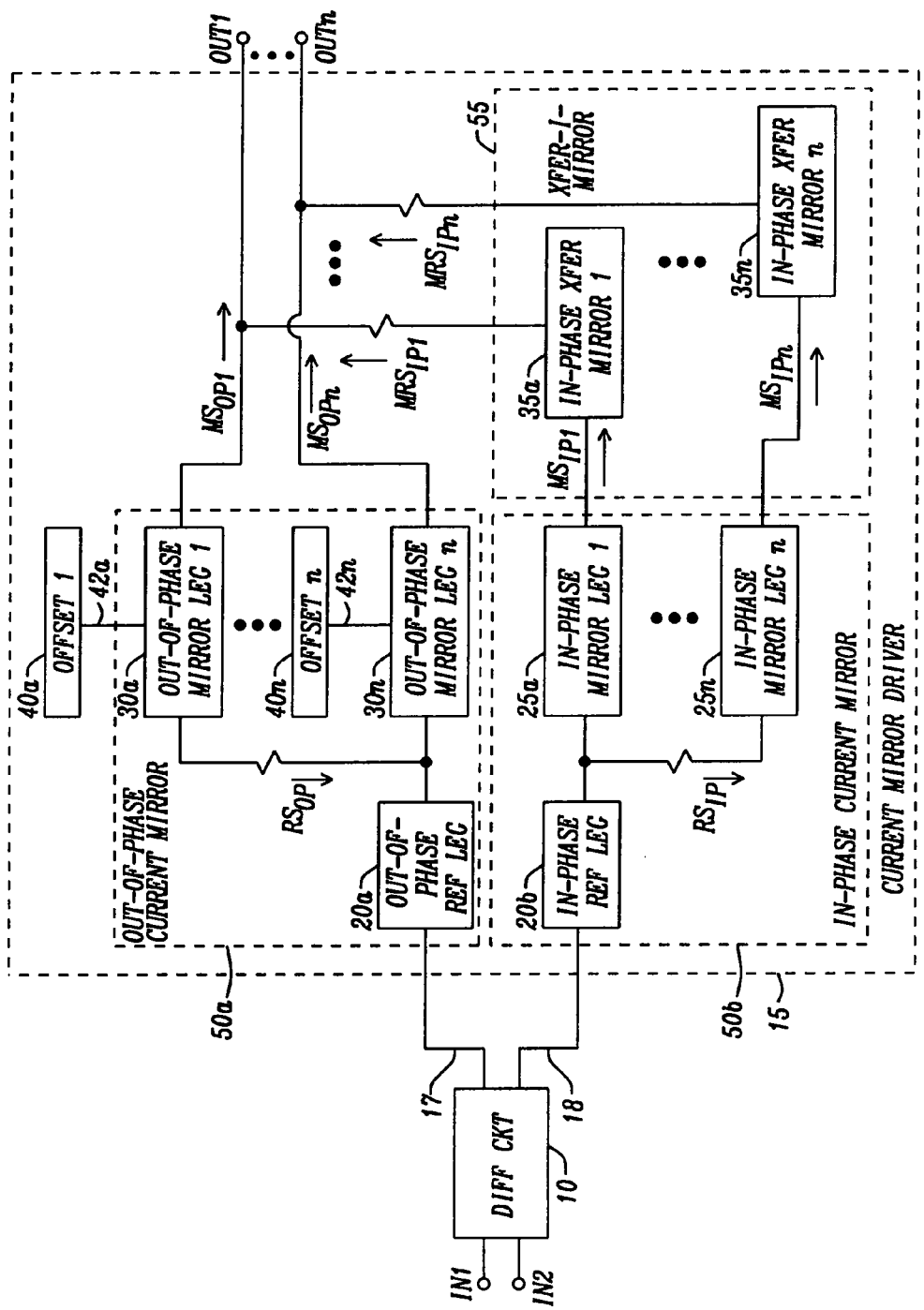
FIG. 1 is a functional block diagram of a multiple output offset comparator embodying the principles of this disclosure.

FIG. 1 is a functional block diagram of a multiple output offset comparator 5. The multiple output offset comparator includes a difference circuit 10 that receives a first input signal IN1 and a second input signal IN2. The difference circuit generates an out-of-phase signal 17 and in-phase signal 18 that has an amplitude that represents a difference in the magnitude of the first input signal IN1 and a second input signal IN2. The out-of-phase signal 17 is applied to an out-of-phase current mirror 50a. The out-of-phase current mirror 50 has out-of-phase reference leg 20a that generates an out-of-phase reference signal $RS_{OP}$ based on the amplitude of the out-of-phase signal 17. The in-phase signal 18 is applied to an in-phase current mirror 50b. The in-phase current mirror 50b has in-phase reference leg 20b that generates an in-phase reference signal $RS_{IP}$ based on the amplitude of the in-phase signal 18.

The in-phase reference signal $RS_{IP}$ is applied to at least one in-phase mirror legs 25a . . . 25n of the in-phase current mirror 50b and the out-of-phase reference signal $RS_{OP}$ is applied to at least one out-of-phase mirror legs 30a . . . 30n of the out-of-phase current mirror 50a. Each of the at least one in-phase mirror legs 25a . . . 25n generates an in-phase mirror signal MSIP1, . . . , MSIPn and each of the at least one out-of-phase mirror legs 30a . . . 30n generates an out-of-phase mirror signal MSOP1, . . . , MSOPn. The in-phase mirror signal MSIP1, . . . , MSIPn is transferred to transferred to the transfer current mirror 55. The transfer current mirror 55 has at least one in-phase transfer mirror 35a, . . . , 35n. The output of each at least one in-phase transfer mirror 35a, . . . , 35n is an at least one mirrored in-phase reference signal $MRS_{IP1}$, . . . , $MRS_{IPn}$ that is applied to the output of the at least one out-of-phase mirror legs 30a . . . 30n of the out-of-phase current mirror 50a to be combined with the out-of-phase mirror signal MSOP1, . . . , MSOPn to form the multiple digital output signals OUT1, . . . , OUTn. The out-of-phase mirror legs 30a . . . 30n optionally have an offset circuit 40a, . . . , 40n that injects or extracts an offset signal 42a, . . . , 42n to each of the out-of-phase mirror legs 30a . . . 30n. The offset signal 42a, . . . , 42n is injected or extracted from the out-of-phase mirror signal MSOP1, . . . , MSOPn to adjust the apparent threshold of the comparator. The modified out-of-phase mirror signal MSOP1, . . . , MSOPn as combined with the mirrored in-phase reference signal $MRS_{IP1}$, . . . , $MRS_{IPn}$ forms a first digital output signal OUT1, . . . , OUTn of the multiple digital output signals OUT1, . . . , OUTn that indicates the digital state signifying whether the first input signal IN1 is greater than or lesser than the second input signal IN2 and forms a second digital output signal OUT1, . . . , OUTn of the multiple digital output signals OUT1, . . . , OUTn that indicates the Digital state signifying whether the first input signal (IN1) is greather than or lesser than The second input signal (IN2) as adjusted by the offset signal 42a, . . . , 42n.

The difference circuit 10 is formed using a traditional input pair of transistors of a differential amplifier with biasing. The current mirror driver 15 is the primary output stage that is formed by folding the output of the input pair of transistors of the difference circuit 10 to a pair of current mirrors (the out-of-phase current mirror 50a and the in-phase current mirror 50b), which compares the current in each arm to determine which input is higher.

In various embodiments, the difference circuit 10 is formed of an operational transconductance amplifier that is implemented using NMOS transistors, PMOS transistors, or with NPN or PNP bipolar transistors. In some embodiments, the difference circuit 10 is formed by current steering (folded cascode) type of amplifier. Still other embodiments may include other forms of the difference circuit 10 and be in keeping with the intent of this disclosure. The important feature is that the offset voltage generated by the by the voltage mismatch of the input stage of the difference circuit 10 is compensated for in the second (or subsequent) stages of the current mirror driver 15 so that the main source of mis-match (the input stage) is shared between the different threshold outputs. The offset circuits 40a, . . . , 40n injects or extracts an offset signal 42a, . . . , 42n to each of the out-of-phase mirror legs 30a . . . 30n force the sharing of the offset signal among the different thresholds of the at least one digital output signals OUT1, . . . , OUTn.

A second current mirror (the out-of-phase current mirror 50a) is formed to create an identical replica of the main output stage (the in-phase current mirror 50b). A current is injected into the second current mirror to offset the threshold.

The input pair of transistors of the differential amplifier of the difference circuit 10 is typically the greatest source of mismatch in a comparator. As the input pair of transistors of the differential amplifier is shared between current mirrors (the out-of-phase current mirror 50a and the in-phase current mirror 50b) of the two output stages, the two thresholds track each other as long as the offset threshold level is greater than the much smaller, mismatch of the later stages, the thresholds will not cross. The threshold offset is therefore well controlled. The injected current is proportional to the current in the input pair of transistors of the differential amplifier to make the added offset very accurately controlled.

Figure 2:
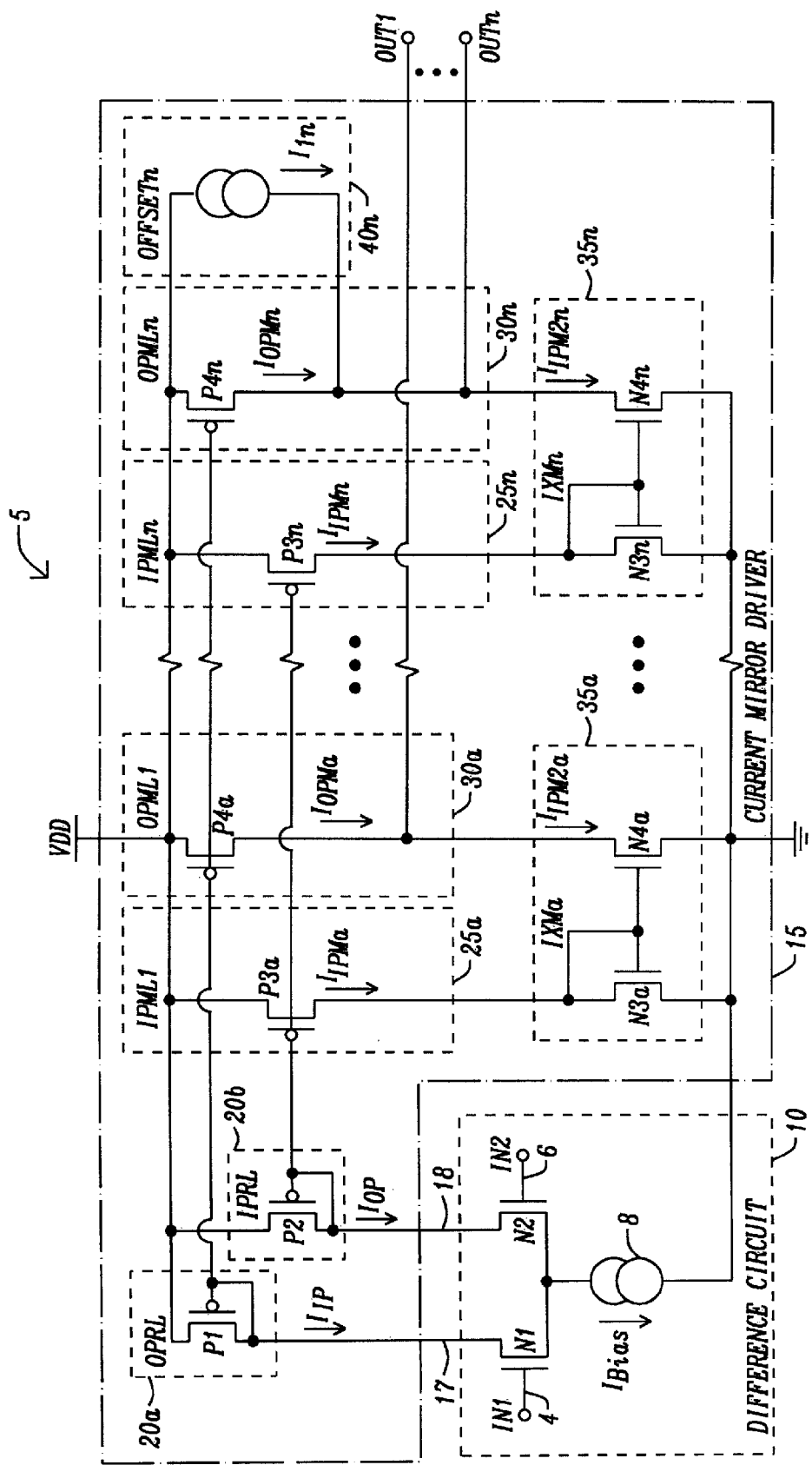
FIG. 2 is a schematic diagram of a first implementation of a multiple output offset comparator embodying the principles of this disclosure.

FIG. 2 is a schematic diagram of a first implementation of a multiple output offset comparator 5. The multiple output offset comparator 5 has a difference circuit 10 that has two input terminals 4 and 6 to receive the two input signals IN1 and IN2. The two input terminals 4 and 6 are connected to the gates of the input pair of transistors N1 and N2. The sources of the input pair of transistors N1 and N2 are commonly connected and connected to a first terminal of a biasing current source 8. The second terminal of the biasing current source 8 is connected to a ground reference voltage source. The drains of the input pair of transistors N1 and N2 provide the output terminals 17 and 18 of the difference circuit 10.

The output terminals 17 and 18 are the input terminals of the current mirror driver 15. The mirror driver 15 includes the out-of-phase current mirror 50a, the in-phase current mirror 50b, the transfer current mirror 55, and the at least one offset circuit 40n. The output terminal 17 is connected to the out-of-phase mirror reference leg 20a of the out-ofphase current mirror 50a and the output terminal 18 is connected to the in-phase mirror reference leg 20b of the in-phase current mirror 50b. The out-of-phase reference leg 20a is formed of a first diode connected PMOS transistor P1. The gate and drain of the first diode connected PMOS transistor P1 are connected to the drain of the first NMOS transistor N2 of the input pair of transistors N1 and N2 of the difference circuit 10. The in-phase reference leg 20b is formed of a second diode connected PMOS transistor P2. The gate and drain of the second diode connected PMOS transistor P2 are connected to the drain of the second NMOS transistor N2 of the input pair of transistors N1 and N2. As is known in the art, the biasing current $I_{BIAS}$ as generated by the biasing current source 8 is equal to the sum of the two mirror reference currents $I_{OP}$ and $I_{IP}$ and form the output signals of the difference circuit 10.

The out-of-phase reference leg 20a is combined with at least one out-of-phase mirror leg 30a, ..., 30n to form a out-of-phase current mirror 50a. The in-phase reference leg 20b is combined with at least one in-phase mirror leg 25a, ..., 25n to form a in-phase current mirror 50b. The gate and drain of the first diode connected PMOS transistor P1 of the out-of-phase reference leg 20a is connected to the gates of the PMOS mirror transistors P4a, ..., P4n. The gate and drain of the second diode connected PMOS transistor P2 of the in-phase reference leg 20b is connected to the gates of the PMOS mirror transistors P3a, ..., P3n. The sources of the PMOS mirror transistors P3a, ..., P3n and the PMOS mirror transistors P4a, ..., P4n are connected to the power supply voltage source. The drain of the PMOS mirror transistor P3a, ..., P3n of each of the in-phase mirror legs 30a, ..., 30n provide the in-phase mirrored current $I_{IPMa}, \ldots, I_{IPMn}$. The drain of the PMOS mirror transistor P4a, P4n of each of the out-of-phase mirror legs 30a, ..., 30n provide the out-of-phase mirrored current $I_{OPMa}, \ldots, I_{OPMn}$.

The transfer current mirror 55 of the current mirror driver 15 has at least one current transfer mirror 35a, ..., 35n One current transfer mirror 35a, ..., 35n is coupled to each in-phase mirror leg 25a, ..., 25n and each associated out-of-phase mirror leg 30a, ..., 30n. Each current transfer mirror 35a, ..., 35n has a diode connected NMOS reference transistor N3a, ..., N3n. The gate and drain of the diode connected NMOS transistor N3a, ..., N3n is connected to the drain of the PMOS mirror transistor P3a, ..., P3n to form a transfer reference current leg of the current transfer mirror 35a, ..., 35n. The gate and drain of the diode connected NMOS reference transistor N3a, ..., N3n is connected to a gate of a NMOS mirror transistor N4a, ..., N4n. The drain of the NMOS mirror transistor N4a, ..., N4n is connected to the drain of the PMOS mirror transistor P4a, ..., P4n of each of the out-of-phase mirror leg 30a, ..., 30n to transfer a second mirrored in-phase reference current $I_{IPM2a}, \ldots, I_{IPM2n}$ to be combined with the mirrored out-of-phase current $I_{OPM2}$ to determine the digital output state at the output terminal OUT1, ..., OUTn. The sources of the diode connected NMOS reference transistor N3a, ..., N3n and the NMOS mirror transistor N4a, ..., N4n are connected to the ground reference voltage source.

In FIG. 1 the out-of-phase mirror leg 30a is shown having an offset circuit offset circuit 40a, but in FIG. 2, the out-of-phase mirror leg 30a is shown having no offset circuit. Eliminating the offset circuit 40a indicates that the out-of-phase mirror leg 30a has no offset and is a comparator indicating whether the input signal IN1 is greater than or lesser than the input signal IN2. The offset generated by the offset circuit 40n allows the comparator circuit to have a threshold value that is accurately offset from the equality value of the out-of-phase mirror leg 30a having no offset.

Figure 3:
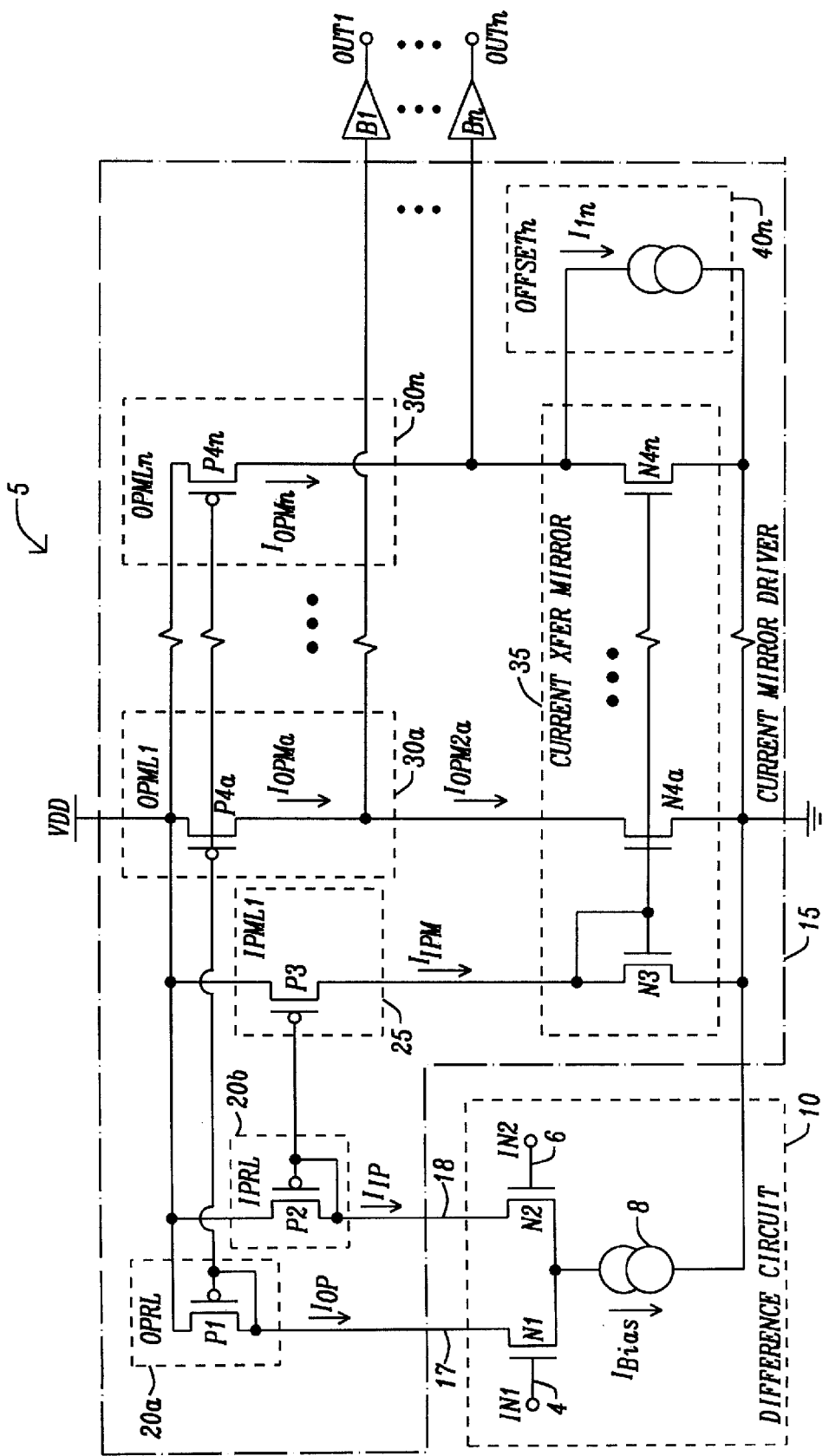
FIG. 3 is a schematic diagram of a second implementation of a multiple output offset comparator embodying the principles of this disclosure.

FIG. 3 is a schematic diagram of a second implementation of a multiple output offset comparator 5. The multiple output offset comparator 5 has a difference circuit 10 that is structured and functions as described above in FIG. 2. The out-of-phase current mirror 50a current mirror driver 15 has an out-of-phase reference leg 20a and the in-phase current mirror 50b current mirror driver 15 an in-phase reference leg 20b that is also, structured and functions as described in FIG. 2. The out-of-phase reference leg 20a is combined with at least one out-of-phase mirror leg 30a, ..., 30n to form a out-of-phase current mirror 50a. The gate and drain of the first diode connected PMOS transistor P1 of the out-of-phase reference leg 20a is connected to the gates of the PMOS mirror transistors P4a, ..., P4n. The sources of the PMOS mirror transistors P4a, ..., P4n are connected to the power supply voltage source. The drain of the PMOS mirror transistor P4a, ..., P4n of each of the out-of-phase mirror legs 30a, ..., 30n provide the out-of-phase mirrored currents $I_{OPMa}, \ldots, I_{OPMn}$.

The in-phase reference leg 20b is combined with the in-phase mirror leg 25 to form a in-phase current mirror 50b. The gate and drain of the second diode connected PMOS transistor P2 of the in-phase reference leg 20b is connected to the gate of the PMOS mirror transistor P3. The source of the PMOS mirror transistor P3 is connected to the power supply voltage source. The drain of the PMOS mirror transistor P3 provides the in-phase mirror current $I_{IPM}$.

The current mirror driver 15 has a current transfer mirror 35. The current transfer mirror 35 is coupled to the in-phase mirror leg 25 and each out-of-phase mirror leg 30a, ..., 30n. The current transfer mirror 35 has a diode connected NMOS reference transistor N3. The gate and drain of the diode connected NMOS transistor N3 is connected to the drain of the PMOS mirror transistor P3 to form a transfer reference current leg of the current transfer mirror 35. The gate and drain of the diode connected NMOS reference transistor N3 is connected to a gate of a NMOS mirror transistors N4a, ..., N4n. The drain of each of the NMOS mirror transistors N4a, ..., N4n is connected to the drain of one of the PMOS mirror transistors P4a, ..., P4n of each of the out-of-phase mirror legs 30a, ..., 30n to transfer a second mirrored in-phase reference current $I_{IPM2a}, \ldots, I_{IPM2n}$ to each out-of-phase mirror leg 30a, ..., 30n to be combined with the out-of-phase mirrored currents $I_{OPMa}, \ldots, I_{OPMn}$ to determine the digital output state at the output terminal OUT1, ..., OUTn. The sources of the diode connected NMOS reference transistors N3a, ..., N3n and the NMOS mirror transistor N4a, ..., N4n are connected to the ground reference voltage source.

As in FIG. 2, the out-of-phase mirror leg 30a of FIG. 3 is shown having no offset circuit. Eliminating the offset circuit 40a indicates that the out-of-phase mirror leg 30a has no offset and is a comparator indicating whether the input signal IN1 is greater than or lesser than the input signal IN2. The offset generated by the offset circuit 40n allows the comparator circuit to have a threshold value that is accurately offset from the equality value of the out-of-phase mirror leg 30a having no offset.

The common connections of the drains of the NMOS mirror transistors N4a, ..., N4n and the drains of the PMOS mirror transistors P4a, ..., P4n are connected to the inputs of the buffer circuits B1, ..., Bn. The buffer circuits B1, ..., Bn receive the digital states for each of the comparator signals for the multiple offsets of the multiple output offset comparator 5 for conditioning and transferring as the digital output signal OUT1, . . . , OUTn to external circuitry.

Figure 4:
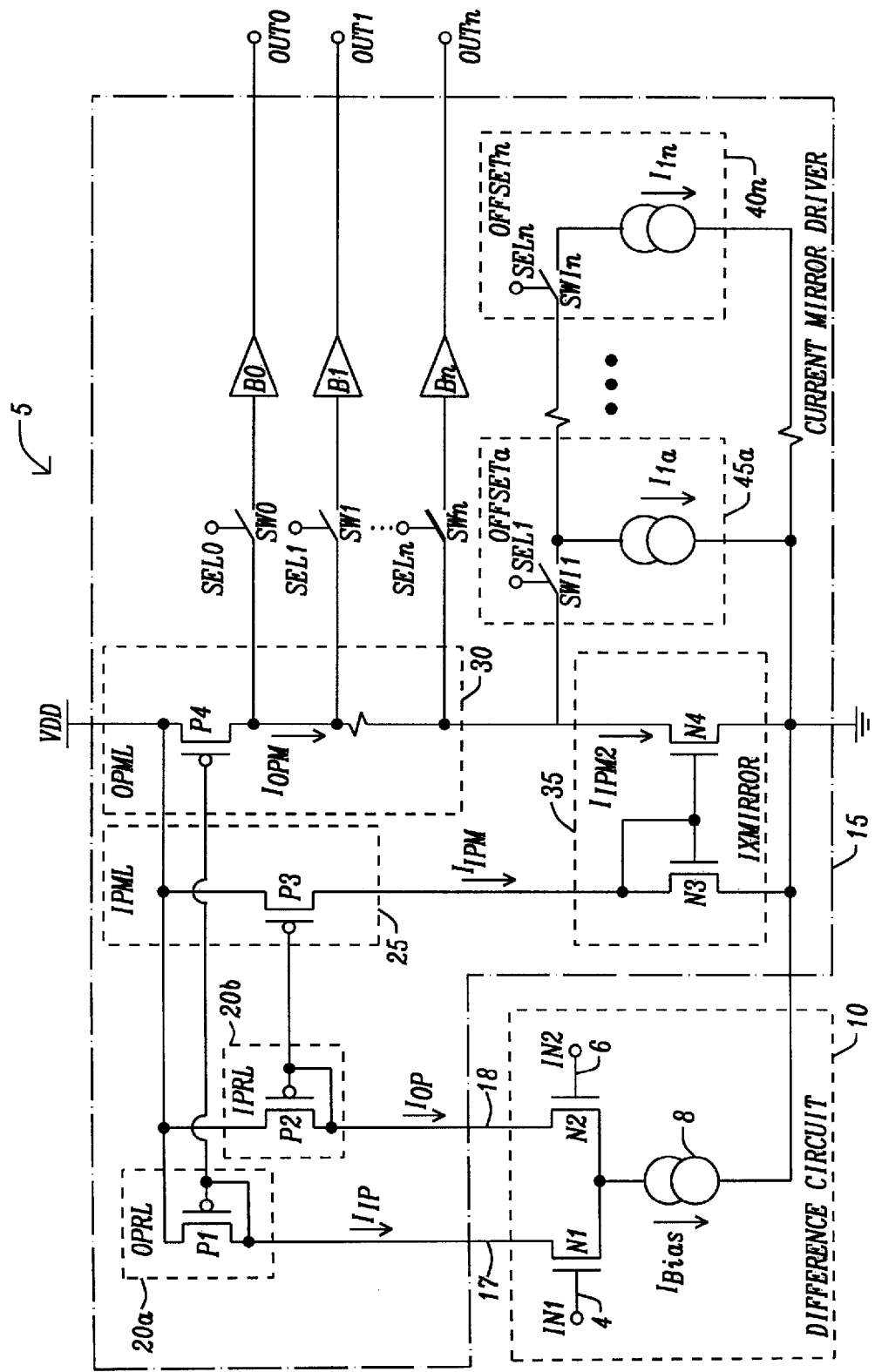
FIG. 4 is a schematic diagram of a third implementation of a multiple output offset comparator embodying the principles of this disclosure.

FIG. 4 is a schematic diagram of a third implementation of a multiple output offset comparator 5. The multiple output offset comparator 5 has a difference circuit 10 that is structured and functions as described above in FIG. 2. Similarly, the current mirror driver 15 has an out-of-phase current mirror 50a with an out-of-phase reference leg 20a and an in-phase current mirror 50b with an in-phase reference leg 20b that is also, structured and functions as described in FIG. 2. The out-of-phase reference leg 20a is combined with an out-of-phase mirror leg 30 to form a out-of-phase current mirror 50a. The gate and drain of the first diode connected PMOS transistor P1 of the out-of-phase reference leg 20a are connected to the gate of the PMOS mirror transistor P4. The source of the PMOS mirror transistor P4 is connected to the power supply voltage source. The drain of the PMOS mirror transistor P4 of each of the out-of-phase mirror legs 30 provide the out-of-phase mirrored current $I_{OPM}$, $I_{OPM}$.

The in-phase reference leg 20b is combined with the in-phase mirror leg 25 to form a in-phase current mirror 50b. The gate and drain of the second diode connected PMOS transistor P2 of the in-phase reference leg 20b are connected to the gate of the PMOS mirror transistor P3. The source of the PMOS mirror transistor P3 is connected to the power supply voltage source. The drain of the PMOS mirror transistor P3 provides the in-phase mirror current $I_{IPM}$.

The current mirror driver 15 has a current transfer mirror 35. The current transfer mirror 35 is coupled to the in-phase mirror leg 25 and the out-of-phase mirror leg 30. The current transfer mirror 35 has a diode connected NMOS reference transistor N3. The gate and drain of the diode connected NMOS transistor N3 is connected to the drain of the PMOS mirror transistor P3 to form a transfer reference current leg of the current transfer mirror 35. The gate and drain of the diode connected NMOS reference transistor N3 is connected to a gate of a NMOS mirror transistor N4. The drain of the NMOS mirror transistors N4 is connected to the drain of the PMOS mirror transistor P4 of the out-of-phase mirror leg 30 to transfer a second mirrored in-phase reference current $I_{IPM2}$ to the out-of-phase mirror leg 30 to be combined with the out-of-phase mirrored currents $I_{OPM}$ to determine the digital output state at the output terminals OUT1, . . . , OUTn. The sources of the diode connected NMOS reference transistor N3 and the NMOS mirror transistor N4 are connected to the ground reference voltage source.

In the third implementation of a multiple output offset comparator 5 of FIG. 4, the digital states of the comparator 5 are time multiplexed to be determined at various times during operation. The common connection between drain of the PMOS transistor P4 of the out-of-phase mirror leg 30 and the drain of the NMOS transistor N4 of the current transfer mirror 35 is connected to a first terminal of each of the output multiplexing switches S0, S1, . . . , Sn. The second terminals of the terminal of each of the output multiplexing switches S0, S1, . . . , Sn are each connected to the input of one of the buffer circuits B1, . . . , Bn. The buffer circuits B1, . . . , Bn receive the digital states for each of the comparator signals for the multiple offsets of the multiple output offset comparator 5 for conditioning and transferring as the digital output signal OUT1, . . . , OUTn to external circuitry.

The threshold offset value is generated by the offset circuits 45a, . . . , 45n that allows the comparator circuit to have multiple threshold values that are accurately offset from the equality value of the out-of-phase mirror leg 30 having no offset (switch SW0 being activated with no offset circuit). The in-phase mirror current $I_{IPM2P}$ is combined with the out-of-phase mirror current $I_{OPM}$. To create the offset threshold voltage required to determine the digital logic states for the plurality of offset threshold voltages, multiple offset circuits 45a, . . . , 45n are connected to be in parallel with the mirror NMOS transistor N4 to generate the selected offset current I1a, . . . , I1n that is extracted in this instance (and may be injected in other embodiments) to be combined with the in-phase mirror current $I_{IPM2}$ and the out-of-phase mirror current $I_{OPM}$ to determine the digital state of the output signals OUT0, . . . , OUTn. Each of the offset circuits 40a, . . . , 40n has a current source that generates the desired offset current I1a, . . . , I1n. Further, each of the offset circuits 40a, . . . , 40n has a switch SWI1, . . . , SWIn. In this implementations, the switches SWI1, . . . , SWIn are connected in series with the switch SWI1 having its first terminal connected to the junction between the drain of the PMOS transistor P4 and the NMOS transistor N4 and the remaining switches . . . , SWIn having their first terminals connected to the second terminal of the previous switch SWI1, . . . , SWIn. The second terminals of each switch SWI1, . . . , SWIn is connected to the current source that generates the desired offset current I1a, . . . , I1n. In this implementations the current sources are selectively placed in parallel such that the desired offset current I1a, . . . , I1n are additively combined. In other implementations the switches SWI1, . . . , SWIn may be in parallel and each of the current sources that generates the desired offset current I1a, . . . , I1n generate a singular current for the offset current.

An external control circuit (not shown) provides a select signal to an activation terminal of the switches SW0, . . . , SWn and the switches SWI1, . . . , SWIn for providing the necessary timing for interleaving for providing the digital output states indicating the state of the comparator for each of the offset threshold values.

Figure 5:
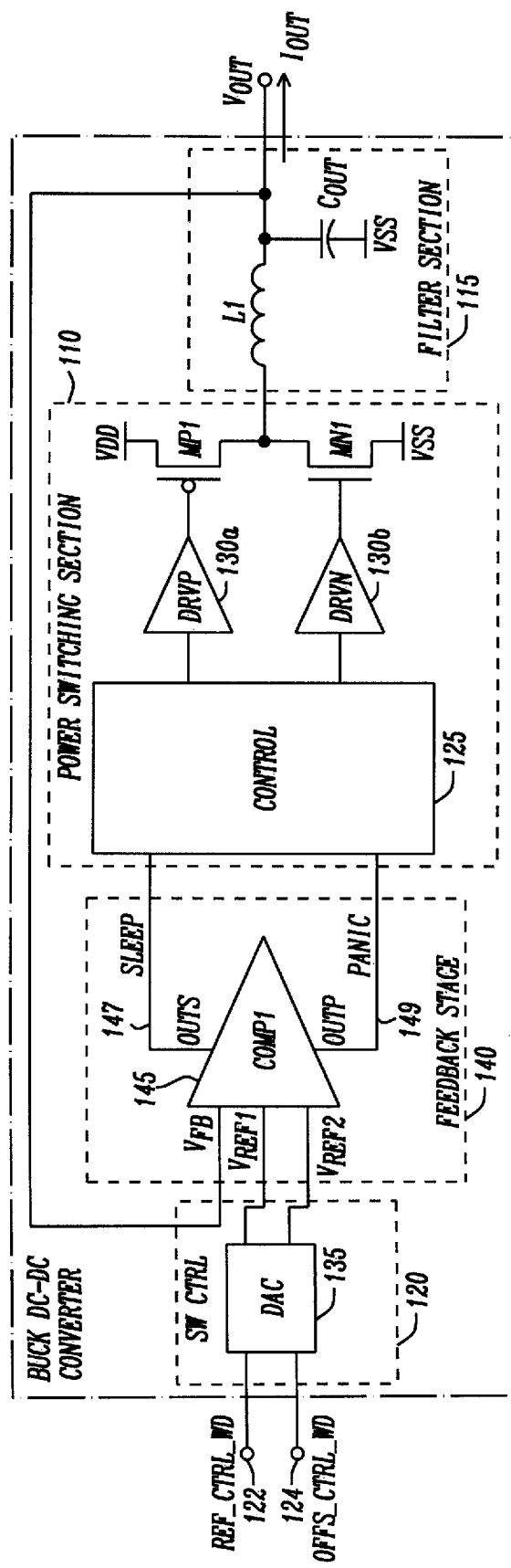
FIG. 5 is a schematic diagram of a buck DC-to-DC converter employing a multiple output offset comparator embodying the principles of this disclosure.

FIG. 5 is a schematic diagram of a buck DC-to-DC converter employing a multiple output offset comparator embodying the principles of this disclosure. The power switching section 110 of the power stage 105 has a control circuit 125 that generates control signals that are applied to a positive input of a driver circuit 130a and a negative input of a driver circuit 130b. The output of the driver circuit 130a is applied to the gate of the PMOS transistor MP1 and the output of the driver circuit 130b is applied to the gate of the NMOS transistor MN1. The source of the PMOS transistor MP1 is connected to the power supply voltage source VDD and the source of the NMOS transistor MN1 is connected to the substrate supply voltage source VSS. The substrate supply voltage source VSS is often the ground reference voltage source, but in some applications is a negative voltage level. The commonly connected drains of the PMOS transistor MP1 and the NMOS transistor MN1 are connected to an input terminal of the filter section 115. The input terminal is a first terminal of an inductor L1. The control circuit determines that during the continuous mode or pulse width modulation mode the control signals are applied to the driver circuit 130a and the driver circuit 130b such that the PMOS transistor MP1 is turned on and the NMOS transistor MN1 is turned off, a current from the power supply voltage source VDD from the first terminal of the inductor L1 out the second terminal of the inductor L1 into the first terminal of the output capacitor $C_{OUT}$ and to the substrate supply voltage source VSS. The output voltage $V_{OUT}$ is present at the junction of the second terminal of the inductor L1 and the output capacitor $C_{OUT}$.

It is known in the art, that the voltage ($V_{L1}$) across the inductor L1 is determined by the formula:

$$V_{L1} = L\frac{dI_L}{dt}$$

The output voltage $V_{OUT}$ is equal to the difference of the power supply voltage source VDD and the voltage $V_{L1}$ across the inductor L1 in the on state and equal to the negative of the voltage $-V_{L1}$ across the inductor L1 in the off state. The duty cycle of the buck DC-to-DC converter determines the on state time and the off state time. It can be shown that the output voltage $V_{OUT}$ is equal to the duty cycle of the buck DC-to-DC converter multiplied by the voltage level of the power supply voltage source VDD.

The feedback section 140 has three inputs. The first input 107 is the feedback voltage $V_{FB}$, that is developed from the output voltage $V_{OUT}$ at common connection of the second terminal of the inductor L1 and the first terminal of the output capacitor $C_{OUT}$. The second and third inputs are the first and second reference voltages $V_{REF1}$ and $V_{REF2}$ generated by the switch control circuit 120. The switch control circuit has a digital-to-analog converter 135 that receives a reference control word 122 and an offset control word 124. The digital-to-analog converter 140 converts the reference control word 136 to the first reference voltage $V_{REF1}$ and the offset control word 124 to the second reference voltage $V_{REF2}$. The first reference voltage $V_{REF1}$ and the second reference voltage $V_{REF2}$ are the second and third inputs to the feedback section 140. The feedback control stage 140 has a multiple output offset comparator 145 for providing a sleep control signal 147 and a panic control signal 149. The sleep control signal 147 indicates that the buck DC-to-DC converter is operating in the discontinuous mode or pulse frequency modulation mode (PFM). When sleep control signal 147 is active, the control circuit 125 activates the driver circuit 130a to turn on the PMOS transistor MP1 to allow current to be passed from the power supply voltage source VDD through the PMOS transistor MP1 to the inductor L1. When the sleep control signal 147 is inactive the output current $I_{OUT}$ to a load circuit is transferred from the inductor L1 and the output capacitor $C_{OUT}$. The panic control signal 149 indicates that the output voltage level of the buck DC-to-DC converter has fallen by the predetermine level below the reference voltage level (i.e. 10 mV). The control circuit 125 activates the driver circuit 130a and the driver circuit 130b to drive the PMOS transistor MP1 and the NMOS transistor MN1 to support a larger load current $I_{OUT}$.

Figure 6:
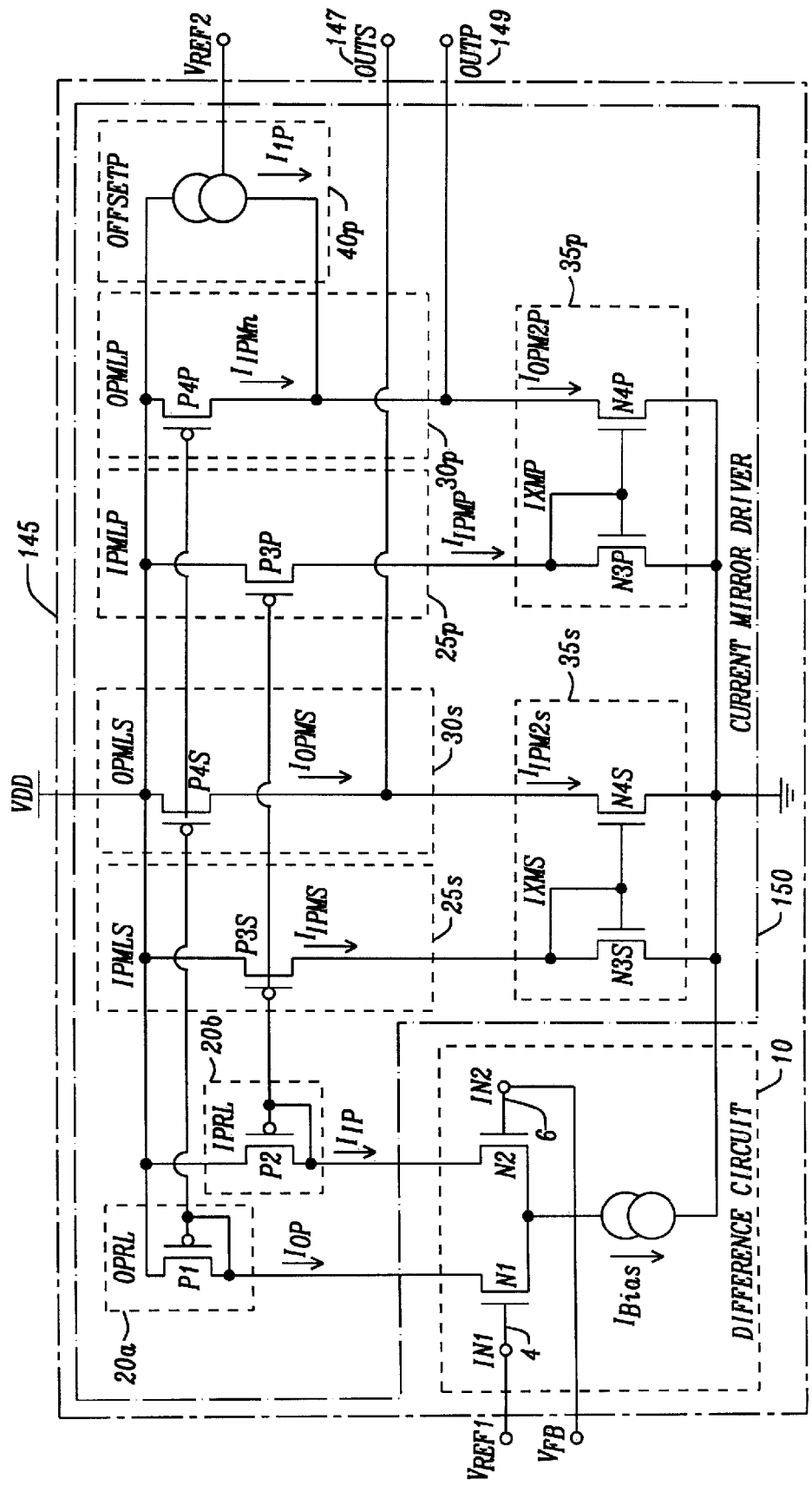
FIG. 6 is a schematic diagram of a first implementation of the multiple output offset comparator embodying the principles of this disclosure of the buck DC-to-DC converter of FIG. 5.
Figure 7:
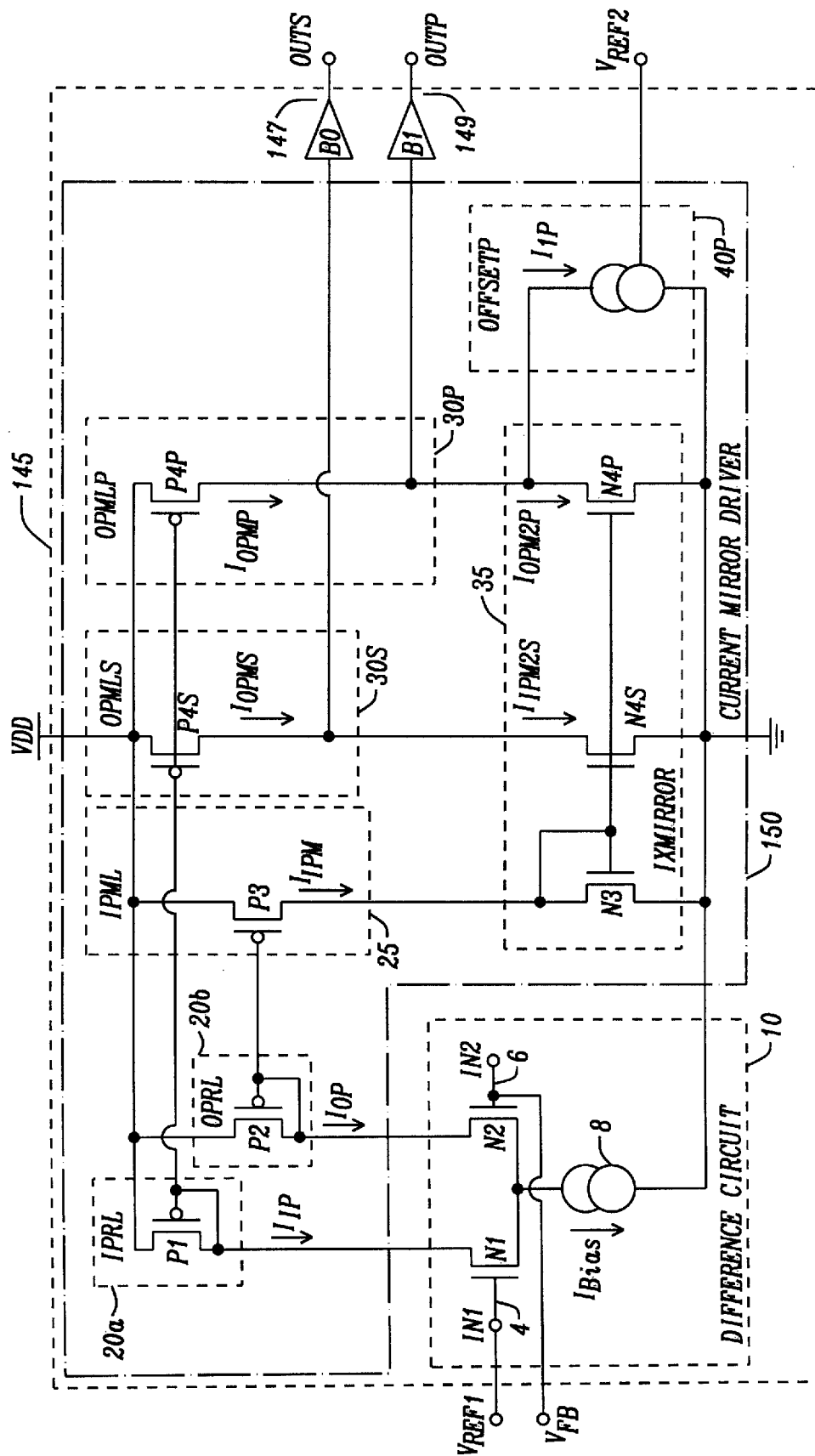
FIG. 7 is a schematic diagram of a second implementation of a multiple output offset comparator embodying the principles of this disclosure of the buck DC-to-DC converter of FIG. 5.
Figure 8:
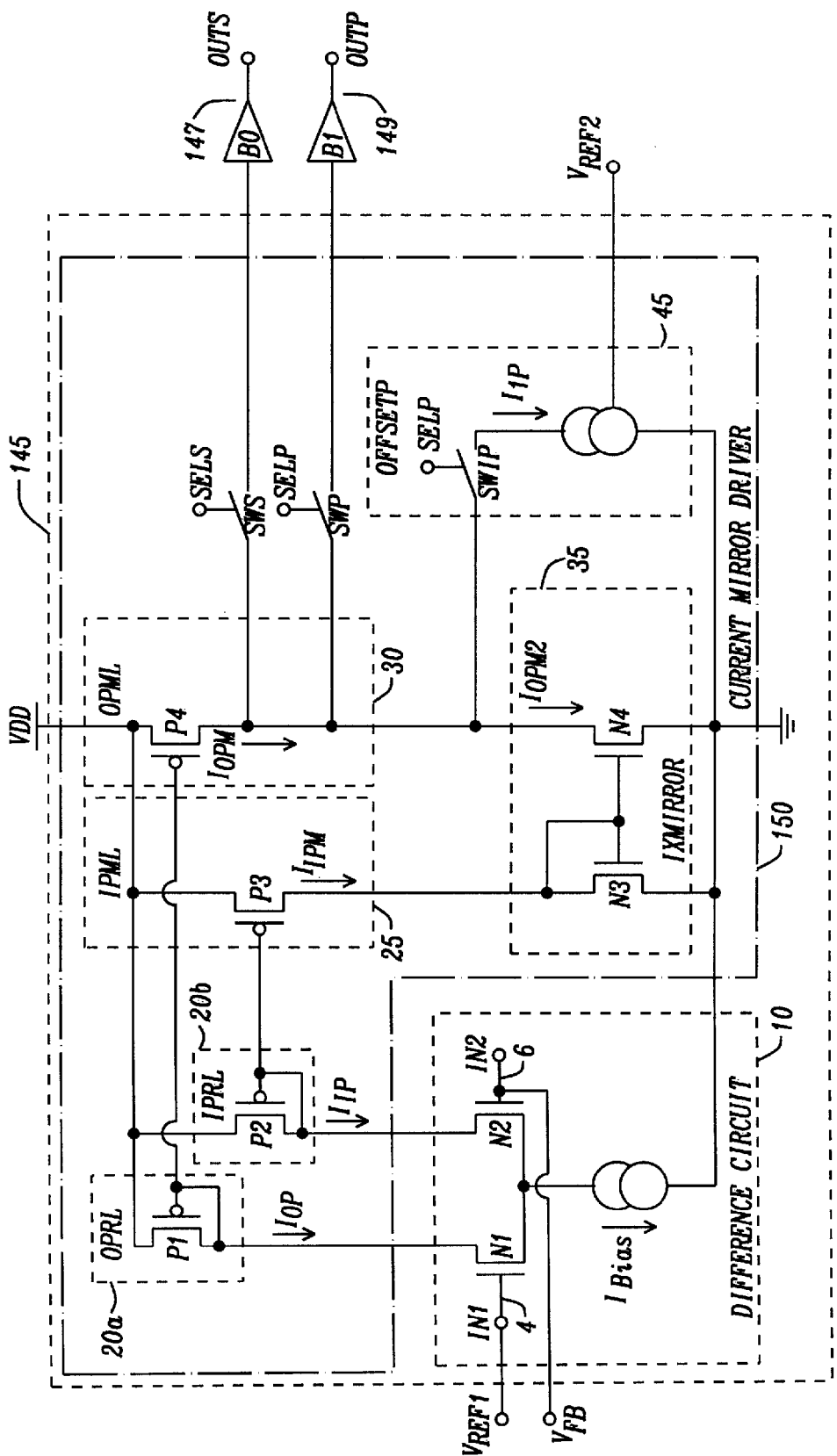
FIG. 8 is a schematic diagram of a third implementation of a multiple output offset comparator embodying the principles of this disclosure of the buck DC-to-DC converter of FIG. 5.

The structure of the comparator circuit 145 is variously as described in FIGS. 6-8 dependent upon the desired implementation. The first reference voltage $V_{REF1}$ is applied to one of the inputs 4 or 6 of the input differential pair of transistors N1 and N2 of the difference circuit 10. The second reference voltage $V_{REF2}$ is applied to the panic offset circuit 30 for generating the offset current I1P that is injected or extracted from the out-of-phase mirror leg 25 as described generally above.

FIG. 6 is a schematic diagram of the first implementation of the multiple output offset comparator 145 as implemented in the buck DC-to-DC converter of FIG. 5. The structure and function of the difference circuit 10 is identical to that of the difference circuit of FIG. 2. The first reference voltage $V_{REF1}$ is applied to the first input terminal 4 and thus connected to the gate of the NMOS transistor N1 of the input differential pair of transistors N1 and N2. The feedback voltage $V_{FB}$ is applied to the second input terminal 6 and thus connected to the gate of the NMOS transistor N2 of the input differential pair of transistors N1 and N2. The drains of the input differential pair of transistors N1 and N2 are connected respectively to the out-of-phase reference leg 20a and the in-phase reference 20b of the current mirror driver 150. As in FIG. 2, the out-of-phase reference leg 20a and the in-phase reference 20b of the current mirror driver 150 are formed respectively of the diode connected PMOS transistor P1 and P2. The gain of the input differential pair of transistors N1 and N2 is sufficiently large that the out-of-phase reference current $I_{OP}$ or the in-phase reference current $I_{IP}$ is approximately equal to the biasing current $I_{Bias}$. The commonly connected gate and drain of the PMOS transistor P1 of the out-of-phase reference leg 20a is connected to the gate of the PMOS transistor P4S of the sleep out-of-phase mirror leg 30s and connected to the gate of the PMOS transistor P4P of the panic out-of-phase mirror leg 30p. The commonly connected gate and drain of the PMOS transistor P2 of the in-phase reference leg 20b is connected to the gate of the PMOS transistor P3S of the sleep in-phase mirror leg 25s and connected to the gate of the PMOS transistor P3P of the panic in-phase mirror leg 25p.

The sleep in-phase mirror leg 25s and the sleep out-of-phase mirror leg 30s are connected to the sleep current transfer mirror 35s. Similarly, the panic in-phase mirror leg 25p and the panic out-of-phase mirror leg 30s are connected to the panic current transfer mirror 35p. As described in FIG. 2, the sleep in-phase mirror current $I_{IPMS}$ is the reference current for the sleep current transfer mirror 35s as applied to the diode connected NMOS transistor N3S. The gate and drain of the diode connected NMOS transistor N3S is connected to the gate of the mirror NMOS transistor N4S such that the second sleep in-phase mirror current $I_{IPM2S}$ is generated. The second sleep in-phase mirror current $I_{IPM2S}$ is combined with the sleep out-of-phase mirror current $I_{OPMS}$ to determine the digital state of the sleep signal OUTS at the output terminal 147.

Again as described in FIG. 2, the panic in-phase mirror current $I_{IPMP}$ is the reference current for the panic current transfer mirror 35p as applied to the diode connected NMOS transistor N3P. The gate and drain of the diode connected NMOS transistor N3P is connected to the gate of the mirror NMOS transistor N4P such that the second panic in-phase mirror current $I_{IPM2P}$ is generated. The second panic in-phase mirror current $I_{IPM2P}$ is combined with the panic out-of-phase mirror current $I_{OPMP}$. To create the offset threshold voltage required to determine the panic condition, the offset circuit 40p generates the panic offset current I1P that is injected in this instance (and may be extracted in other embodiments) to be combined with the second panic in-phase mirror current $I_{IPM2P}$ and the panic out-of-phase mirror current $I_{OPMP}$ to determine the digital state of the panic signal OUTP at the output terminal 149. The second voltage reference $V_{REF2}$ is applied to the current source that generates the panic offset current I1P for providing the ability to program the current source to adjust the offset threshold value as required to insure correct operation of the buck DC-to-DC converter of FIG. 5.

The input differential pair of transistors N1 and N2 is typically the greatest source of mismatch threshold offset in a comparator. As the input differential pair of transistors N1 and N2 is shared between both output stages formed by the out-of-phase mirror legs 30s and 30p, the sleep threshold and the panic threshold will track each other. Further, so long as the offset threshold is greater than the much smaller mismatch caused by the differences in the transistors of the current mirror driver, the offset thresholds will not cross and the offset threshold is therefore well controlled. The injected current is designed to be proportional to the input differential pair of transistors N1 and N2, it is possible to make the added offset very accurately controlled.

FIG. 7 is a schematic diagram of the second implementation of the multiple output offset comparator 145 as implemented in the buck DC-to-DC converter of FIG. 5. The structure and function of the difference circuit 10 is identical to that of the difference circuit of FIG. 2 and is connected to the first reference voltage $V_{REF1}$ and the feedback voltage $V_{FB}$. The drains of the input differential pair of transistors N1 and N2 are connected respectively to the out-of-phase reference leg 20a and the in-phase reference 20b of the current mirror driver 150. As in FIG. 6, the out-of-phase reference leg 20a and the in-phase reference 20b of the current mirror driver 150 are formed respectively of the diode connected PMOS transistor P1 and P2. The gain of the input differential pair of transistors N1 and N2 is sufficiently large that the out-of-phase reference current $I_{OP}$ or the in-phase reference current $I_{IP}$ is approximately equal to the biasing current $I_{Bias}$. The commonly connected gate and drain of the PMOS transistor P1 of the out-of-phase reference leg 20a is connected to the gate of the PMOS transistor P4S of the sleep out-of-phase mirror leg 30s and connected to the gate of the PMOS transistor P4P of the panic out-of-phase mirror leg 30p. The commonly connected gate and drain of the PMOS transistor P2 of the in-phase reference leg 20b is connected to the gate of the PMOS transistor P3 of the in-phase mirror leg 25. There is now a single in-phase mirror leg as shown in FIG. 3.

The in-phase mirror leg 25 and the sleep out-of-phase mirror leg 30s and the panic out-of-phase mirror leg 30s are connected to the current transfer mirror 35. As described in FIG. 3, the in-phase mirror current $I_{IPM}$ is the reference current for the current transfer mirror 35 as applied to the diode connected NMOS transistor N3. The gate and drain of the diode connected NMOS transistor N3 is connected to the gate of the mirror NMOS transistor N4S such that the second sleep in-phase mirror current $I_{IPM2S}$ is generated. The second sleep in-phase mirror current $I_{IPM2S}$ is combined with the sleep out-of-phase mirror current $I_{OPMS}$ to determine the digital state of the sleep signal OUTS at the output terminal 147. Again as described in FIG. 3, the gate and drain of the diode connected NMOS transistor N3 is connected to the gate of the mirror NMOS transistor N4P such that the second panic in-phase mirror current $I_{IPM2P}$ is generated. The second panic in-phase mirror current $I_{IPM2P}$ is combined with the panic out-of-phase mirror current $I_{OPMP}$. To create the offset threshold voltage required to determine the panic condition, the offset circuit 40p is connected to be in parallel with the mirror NMOS transistor N4P and generates the panic offset current I1P that is extracted in this instance (and may be injected in other embodiments) to be combined with the second panic in-phase mirror current $I_{IPM2P}$ and the panic out-of-phase mirror current $I_{OPMP}$ to determine the digital state of the panic signal OUTP at the output terminal 149. The second voltage reference $V_{REF2}$ is applied to the current source that generates the panic offset current I1P for providing the ability to program the current source to adjust the offset threshold value as required to insure correct operation of the buck DC-to-DC converter of FIG. 5.

The common connection between drain of the PMOS transistor P4S of the sleep out-of-phase mirror leg 30s and the drain of the NMOS transistor N4S of the current transfer mirror 35 is connected to the input of the buffer circuit B0.

The common connection between drain of the PMOS transistor P4P of the panic out-of-phase mirror leg 30p and the drain of the NMOS transistor N4P of the current transfer mirror 35 is connected to the input of the buffer circuit B2. The buffer circuits B0 and B2 receive the digital states for the sleep and panic comparator signals for the equal threshold value and the offset threshold value of the multiple output offset comparator 5 for conditioning and transferring as the digital output signal OUTS and OUTP to external circuitry through the terminals 147 and 149.

As described above, the input differential pair of transistors N1 and N2 is typically the greatest source of mismatch threshold offset in a comparator. As the input differential pair of transistors N1 and N2 is shared between both output stages formed by the out-of-phase mirror legs 30s and 30p, the sleep threshold and the panic threshold will track each other. In this implementation, the common reference legs 20a and 20b and the common in-phase mirror leg 25 further, reduce the device mismatches in the offset current to insure that the offset thresholds will not cross and the offset threshold is therefore well controlled.

FIG. 8 is a schematic diagram of a third implementation of a multiple output offset comparator 145 as implemented in the buck DC-to-DC converter of FIG. 5. In the third implementation, the digital states of the comparator 5 are time multiplexed to be determined at various times during operation. The structure and function of the difference circuit 10 is identical to that of the difference circuit of FIG. 2 and is connected to the first reference voltage $V_{REF1}$ and the feedback voltage $V_{FB}$. The drains of the input differential pair of transistors N1 and N2 are connected respectively to the out-of-phase reference leg 20a and the in-phase reference 20b of the current mirror driver 150. As in FIGS. 6 and 7, the out-of-phase reference leg 20a and the in-phase reference 20b of the current mirror driver 150 are formed respectively of the diode connected PMOS transistor P1 and P2. The gain of the input differential pair of transistors N1 and N2 is sufficiently large that the out-of-phase reference current $I_{OP}$ or the in-phase reference current $I_{IP}$ is approximately equal to the biasing current $I_{Bias}$. The commonly connected gate and drain of the PMOS transistor P1 of the out-of-phase reference leg 20a is connected to the gate of the PMOS transistor P4 of the out-of-phase mirror leg 30. The commonly connected gate and drain of the PMOS transistor P2 of the in-phase reference leg 20b is connected to the gate of the PMOS transistor P3 of the in-phase mirror leg 25. There being a single in-phase mirror leg 25 and a single out-of-phase mirror leg 30 as shown in FIG. 4.

The in-phase mirror leg 25 and the out-of-phase mirror leg 30 are connected to the current transfer mirror 35. As described in FIG. 4, the in-phase mirror current $I_{IPM}$ is the reference current for the current transfer mirror 35 as applied to the diode connected NMOS transistor N3. The gate and drain of the diode connected NMOS transistor N3 is connected to the gate of the mirror NMOS transistor N4 such that the second in-phase mirror current $I_{IPM2}$ is generated. The second in-phase mirror current $I_{IPM2}$ is combined with the out-of-phase mirror current $I_{OPM}$ to determine the digital state of the sleep signal OUTS at the output terminal 147. Again as described in FIG. 4, the gate and drain of the diode connected NMOS transistor N3 is connected to the gate of the mirror NMOS transistor N4 such that the second in-phase mirror current $I_{IPM2}$ is generated.

The common connection between drain of the PMOS transistor P4 of the out-of-phase mirror leg 30 and the drain of the NMOS transistor N4 of the current transfer mirror 35 is connected a first terminal of each of the output multiplexing sleep and panic switches SWS and SWP. The output multiplexing sleep and panic switches SWS and SWP are each connected to the input of one of the buffer circuits B0 and B1. The buffer circuits B0 and B1 receive the digital states for the sleep and panic comparator signals for the equal threshold value and the offset threshold value of the multiple output offset comparator 5 for conditioning and transferring as the digital output signal OUTS and OUTP to external circuitry through the terminals 147 and 149.

The panic threshold offset value is generated by the offset circuit 45, . . . , 45n that allows the comparator circuit 145 to have multiple threshold values that are accurately offset from the equality value of the out-of-phase mirror leg 30 having no offset (switch SWS being activated with no offset circuit). The in-phase mirror current $I_{IPM2}$ is combined with the out-of-phase mirror current $I_{OPM}$. To create the offset threshold voltage required to determine the digital logic states for the panic offset threshold voltage, panic offset circuit 45 is connected to be in parallel with the mirror NMOS transistor N4 to generate the panic offset current I1P that is extracted in this instance (and may be injected in other embodiments) to be combined with the in-phase mirror current $I_{IPM2}$ and the out-of-phase mirror current $I_{OPM}$ to determine the digital state of the panic output signal OUTP. The panic offset circuit 45 has a current source that generates the panic offset current I1P. Further, the panic offset circuit 45 has a switch SWIP. The second terminal of each switch SWIP is connected to the current source that generates the panic offset current I1P.

The second voltage reference $V_{REF2}$ is applied to the current source that generates the panic offset current I1P for providing the ability to program the current source to adjust the offset threshold value as required to insure correct operation of the buck DC-to-DC converter of FIG. 5.

An external control circuit (not shown) provides a select signal SELS and SELP to an activation terminal of the switches SWS and SWP and the switch SWIP, . . . , SWIn for providing the necessary timing for interleaving to provide the digital output states indicating the sleep state and the panic state of the comparator for each of the threshold values. As described above, the input differential pair of transistors N1 and N2 is typically the greatest source of mismatch threshold offset in a comparator. As the input differential pair of transistors N1 and N2 is shared between both output stages formed by the out-of-phase mirror leg 30, the sleep threshold and the panic threshold will track each other. In this implementation, the common reference legs 20a and 20b, the common in-phase mirror leg 25 and the out-of-phase mirror leg 30 further, reduce the device mismatches in the offset current to insure that the offset thresholds will not cross and the offset threshold is therefore well controlled.

While this disclosure has been particularly shown and described with reference to the preferred embodiments thereof, it will be understood by those skilled in the art that various changes in form and details may be made without departing from the spirit and scope of the disclosure. For instance, it is known in the art that bipolar junction transistors may be exchanged for the MOS transistors and still is in keeping with the intent of the principles of this disclosure. Further, the NMOS transistors may be replaced with PMOS transistors and the PMOS transistors replaced with NMOS transistors and still is in keeping with the intent of the principles of this disclosure.

What is claimed is:

1. A multiple output comparator configured to compare a first input signal with a second input signal and at least one threshold offset voltage level, comprising:
   a difference circuit configured to receive a first input signal and a second input signal to determine when a magnitude of the first input signal is greater than or lesser than the second input signal and configured to provide a true output signal and a complement output signal that are indicative that magnitude of the first input signal is greater than or lesser than the second input signal;
   an output mirror driver circuit in communication with the difference circuit for receiving the true output signal and the complement output signal comprising:
      a first mirror circuit configured for receiving the true output signal from the difference circuit and configured for generating at least one mirrored true output signal indicating that the first input signal is greater than or lesser than the second input signal;
      a second mirror circuit configured for receiving the complement output signal from the difference circuit and configured for generating at least one mirrored complement output signal indicating that the first input signal is greater than or lesser than the second input signal as offset by the at least one threshold offset voltage level wherein the at least one mirrored complement output signal is combined with an associated at least one mirrored in-phase reference signal to form a plurality of digital output signals; and
      at least one offset generator in communication with the second mirror circuit and configured for accurately generating the at least one threshold offset voltage level to ensure that the first input signal is greater than or lesser than the second input signal as offset by the at least one threshold offset voltage level.

2. The multiple output comparator of claim 1 wherein the output mirror driver circuit further comprises:
   a transfer mirror circuit in communication with the first mirror driver for receiving true comparison result signals configured for generating at least one mirrored in-phase reference signal for transfer to an associated at least one second mirror leg to be combined with the at least one mirrored complement output signal for determining that the first input signal is greater than or lesser than the second input signal for the primary output terminal and the first input signal is greater than or lesser than the second input signal as offset by the at least one threshold offset voltage level wherein a first digital output signal of the plurality digital output signals indicates a digital state signifying whether the first input signal is greater than or lesser than the second input signal and a second digital output signal of the plurality of digital output signals indicates the digital state signifying whether the first input signal is greater than or lesser than the second input signal as adjusted by the at least one threshold offset voltage level.

3. The multiple output comparator of claim 2 wherein the first mirror circuit comprises:
   a first mirror reference leg in communication with the difference circuit for receiving the true output signal and configured for generating a first reference mirror signal; and
   at least one first mirror leg connected to the first mirror reference leg for generating the true comparison result signals.

4. The multiple output comparator of claim 3 wherein the second mirror driver comprises:

a second mirror reference leg in communication with the difference circuit for receiving the complement output signal and configured for generating a second reference mirror signal; and at least one second mirror leg connected to the second mirror reference leg for receiving the second reference mirror signal and configured for generating the complement output signal from the second reference mirror signal.

5. The multiple output comparator of claim 4 wherein the second mirror reference leg comprises a second diode connected MOS transistor of the second conductivity type with its gates and drains commonly connected through the output terminals of the difference circuit to the drains of the second transistor of the pair of transistors of the differential amplifier and its source is connected to a supply voltage source.

6. The multiple output comparator of claim 5 wherein the at least one second mirror leg comprises a second MOS transistor of the second conductivity type having a gate connected to the commonly connected gate and drain of the second diode connected MOS transistor, its source connected to the supply voltage source, and a drain.

7. The multiple output comparator of claim 3 wherein the first mirror reference leg comprises a first diode connected MOS transistor of a second conductivity type with its gate and drain commonly connected through the output terminals of the difference circuit and its source is connected to a supply voltage source.

8. The multiple output comparator of claim 7 wherein the at least one second mirror leg comprises a first MOS transistor of the second conductivity type having a gate connected to the commonly connected gate and drain of the first diode connected MOS transistor, its source connected to the supply voltage source, and a drain.

9. The multiple output comparator of claim 2 wherein the at least one transfer mirror circuit comprises:
a transfer mirror reference leg connected to an associated first mirror driver for receiving the mirrored true output signal of the first mirror circuit configured for generating a reference mirrored true output signal;
a transfer mirror leg connected to the transfer mirror reference leg for receiving the reference mirrored true output signal and configured for generating a second mirrored true reference signal to be transferred to an associated complement mirror leg to be combined with the mirrored complement output signal to determine the digital state at the output terminals indicating that the magnitude of the first input signal is greater than or lesser than the second input signal.

10. The multiple output comparator of claim 9 wherein at least one offset generator is connected in parallel with the associated second mirror driver to inject or extract the at least one threshold offset voltage level to accurately offset the second input signal by an offset threshold value to ensure that the first input signal is greater than or lesser than the second input signal as offset by the at least one threshold offset voltage level.

11. The multiple output comparator of claim 9 wherein the transfer mirror reference leg comprises a diode connected MOS transistor of the first conductivity type having a gate and drain commonly connected to receive the mirrored true output signal and a source connected to a reference voltage source.

12. The multiple output comparator of claim 11 wherein the transfer mirror leg comprises a MOS transistor of the first conductivity type having a gate connected to the commonly connected gate and drain of the diode connected MOS transistor of the first conductivity type, a drain connected to the associated second mirror driver to be combined with the mirrored complement output signal, and a source connected to the reference voltage source.

13. The multiple output comparator of claim 2 wherein the at least one offset generator comprises a current source that injects or extracts a current from the first mirror driver or the second mirror driver to generate the at least one threshold offset voltage level to accurately offset the second input signal.

14. The multiple output comparator of claim 13 wherein the at least one offset generator further comprises a selection switch in series with the current source such that a plurality of offset generators are connected to the first mirror driver or the second mirror driver to selectively adjust the current injected or extracted from the first mirror driver or the second mirror driver to program the at least one threshold offset voltage level.

15. The multiple output comparator of claim 1 wherein the difference circuit comprises:
a pair of transistors of a first conductivity type connected as a differential amplifier where the first input signal is provided to a gate of a first transistor of the pair of transistors and the second input signal is provided to the gate of a second transistor of the pair of transistors;
a biasing source including a first terminal connected to the commonly connected sources of the pair of transistors and a second terminal connected to a reference voltage source, wherein drains of the pair of transistors are connected to form a first output terminal and a second output terminal of the difference circuit and are connected as the inputs to the output mirror driver circuit.

16. An integrated circuit that compares an input signal with multiple offset threshold voltage levels to determine that the signal has a level that is within a range of the multiple offset threshold voltage levels a reference threshold voltage level, the integrated circuit comprising:
a multiple output comparator configured to compare a first input signal with a second input signal and at least one threshold offset voltage level comprising:
a difference circuit configured to receive a first input signal and a second input signal to determine when a magnitude of the first input signal is greater than or lesser than the second input signal and configured to provide a true output signal and a complement output signal that are indicative that magnitude of the first input signal is greater than or lesser than the second input signal; and
an output mirror driver circuit in communication with the difference circuit for receiving the true output signal and the complement output signal comprising:
a first mirror circuit configured for receiving the true output signal from the difference circuit and configured for generating at least one mirrored true output signal indicating that the first input signal is greater than or lesser than the second input signal;
a second mirror circuit configured for receiving the complement output signal from the difference circuit and configured for generating at least one mirrored complement output signal indicating that the first input signal is greater than or lesser than the second input signal as offset by the at least one threshold offset voltage level, wherein the at least one mirrored complement output signal is combined with an associated at least one mirrored in-phase reference signal to form a plurality of digital output signals; and at least one offset generator in communication with the second mirror circuit and configured for accurately generating the at least one threshold offset voltage level to ensure that the first input signal is greater than or lesser than the second input signal as offset by the at least one threshold offset voltage level.

17. The integrated circuit of claim 16 wherein the output mirror driver circuit further comprises:
a transfer mirror circuit in communication with the first mirror driver for receiving true comparison result signals and configured for generating at least one mirrored in-phase reference signal for transfer to an associated at least one second mirror leg to be combined with the at least mirrored complement output signal for determining that the first input signal is greater than or lesser than the second input signal for the primary output terminal and the first input signal is greater than or lesser than the second input signal as offset by the at least one threshold offset voltage level, wherein a first digital output signal of the plurality digital output signals indicates the digital state signifying whether the first input signal is greater than or lesser than the second input signal and a second digital output signal of the plurality of digital output signals indicates the digital state signifying whether the first input signal is greater than or lesser than the second input signal as adjusted by the at least one threshold offset voltage level.

18. The integrated circuit of claim 17 wherein the first mirror circuit comprises:
a first mirror reference leg in communication with the difference circuit for receiving the true output signal and configured for generating a first reference mirror signal; and
at least one first mirror leg connected to the first mirror reference leg for generating the true comparison result signals.

19. The integrated circuit of claim 18 wherein the second mirror driver comprises:
a second mirror reference leg in communication with the difference circuit for receiving the complement output signal and configured for generating a second reference mirror signal; and
at least one second mirror leg connected to the second mirror reference leg for receiving the second reference mirror signal and configured for generating the complement output signal from the second reference mirror signal.

20. The integrated circuit of claim 19 wherein the second mirror reference leg comprises a second diode connected MOS transistor of the second conductivity type with its gates and drains commonly connected through the output terminals of the difference circuit to the drains of the second transistor of the pair of transistors of the differential amplifier and its source is connected to a supply voltage source.

21. The integrated circuit of claim 20 wherein the at least one second mirror leg comprises a second MOS transistor of the second conductivity type having a gate connected to the commonly connected gate and drain of the second diode connected MOS transistor, its source connected to the supply voltage source, and a drain.

22. The integrated circuit of claim 18 wherein the first mirror reference leg comprises a first diode connected MOS transistor of a second conductivity type with its gate and drain commonly connected through the output terminals of the difference circuit and its source is connected to a supply voltage source.

23. The integrated circuit of claim 22 wherein the at least one second mirror leg comprises a first MOS transistor of the second conductivity type having a gate connected to the commonly connected gate and drain of the first diode connected MOS transistor, its source connected to the supply voltage source, and a drain.

24. The integrated circuit of claim 17 wherein the transfer mirror circuit comprises:
a transfer mirror reference leg connected to an associated first mirror leg for receiving the mirrored true output signal of the first mirror circuit configured for generating a reference mirrored true output signal;
a transfer mirror leg connected to the transfer mirror reference leg for receiving the reference mirrored true output signal and configured for generating a second mirrored true reference signal to be transferred to an associated complement mirror leg to be combined with the mirrored complement output signal to determine the digital state at the output terminals indicating that the magnitude of the first input signal is greater than or lesser than the second input signal.

25. The integrated circuit of claim 24 wherein at least one one offset generator is connected in parallel with the associated second mirror driver to inject or extract the threshold offset voltage level to accurately offset the second input signal by an offset threshold value to ensure that the first input signal is greater than or lesser than the second input signal as offset by the at least one threshold offset voltage level.

26. The integrated circuit of claim 24 wherein one offset generator is connected in parallel with the transfer mirror leg to inject or extract the threshold offset voltage level to accurately offset the second input signal by an offset threshold value to ensure that the first input signal is greater than or lesser than the second input signal as offset by the at least one threshold offset voltage level.

27. The integrated circuit of claim 24 wherein the transfer mirror reference leg comprises a diode connected MOS transistor of the first conductivity type having a gate and drain commonly connected to receive the mirrored true output signal and a source connected to a reference voltage source.

28. The integrated circuit of claim 27 wherein the transfer mirror leg comprises a MOS transistor of the first conductivity type having a gate connected to the commonly connected gate and drain of the diode connected MOS transistor of the first conductivity type, a drain connected to the associated second mirror driver to be combined with the mirrored complement output signal, and a source connected to the reference voltage source.

29. The integrated circuit of claim 17 wherein the at least one offset generator comprises a current source that injects or extracts a current from the first mirror driver or the second mirror driver to generate the at least one threshold offset voltage level to accurately offset the second input signal.

30. The integrated circuit of claim 29 wherein the at least one offset generator further comprises a selection switch in series with the current source such that a plurality of offset generators are connected to the first mirror driver or the second mirror driver to selectively adjust the current injected or extracted from the first mirror driver or the second mirror driver to program the at least one threshold offset voltage level.

31. The integrated circuit of claim 16 wherein the difference circuit comprises:
a pair of transistors of a first conductivity type connected as a differential amplifier where the first input signal is provided to a gate of a first transistor of the pair of transistors and the second input signal is provided to the gate of a second transistor of the pair of transistors;

a biasing source including a first terminal connected to the commonly connected sources of the pair of transistors and a second terminal connected to a reference voltage source, wherein drains of the pair of transistors are connected to form a first output terminal and a second output terminal of the difference circuit and are connected as the inputs to the output mirror driver circuit.

32. A dual output comparator configured for comparing a first input signal with a second input signal and a signal level of the input signal offset by a threshold offset signal level comprising:

a difference circuit configured to receive a first input signal and a second input signal and configured to determine when a magnitude of the first input signal is greater than or lesser than the second input signal and provides a true output signal and a complement output signal that are indicative that magnitude of the first input signal is greater than or lesser than the second input signal; and an output mirror driver circuit in communication with the difference circuit for receiving the true output signal and the complement output signal comprising:

a first mirror circuit configured for receiving the true output signal from the difference circuit and indicating that the first input signal is greater than or lesser than the second input signal;

a second mirror circuit configured for receiving the complement output signal from the difference circuit indicating that the first input signal is greater than or lesser than the second input signal as offset by the threshold offset voltage level, wherein the at least one mirrored complement output signal is combined with an associated at least one mirrored in-phase reference signal to form a plurality of digital output signals; and at least one offset generator in communication with the second mirror circuit and configured for accurately generating the threshold offset voltage level to ensure that the first input signal is greater than or lesser than the second input signal as offset by the threshold offset voltage level.

33. The dual output comparator of claim 32 wherein the output mirror circuit further comprises:

a transfer mirror circuit in communication with the first mirror driver for receiving true comparison result signals and configured for generating a mirrored in-phase reference signal for transfer to the associated second mirror circuit to be combined with the mirrored complement output signal for determining that the first input signal is greater than or lesser than the second input signal for the primary output terminal and the first input signal is greater than or lesser than the second input signal as offset by the threshold offset voltage level wherein a first digital output signal of the plurality digital output signals indicates the digital state signifying whether the first input signal is greater than or lesser than the second input signal and a second digital output signal of the plurality digital output signals indicates the digital state signifying whether the first input signal is greater than or lesser than the second input signal as adjusted by the offset signal.

34. The dual output comparator of claim 33 wherein the first mirror circuit comprises:

a first mirror reference leg in communication with the difference circuit for receiving the true output signal and configured for generating a first reference mirror signal; and a first mirror leg connected to the first mirror reference leg for generating the true comparison result signals.

35. The dual output comparator of claim 34 wherein the second mirror driver comprises:

a second mirror reference leg in communication with the difference circuit for receiving the complement output signal and configured for generating a second reference mirror signal; and a second mirror leg connected to the second mirror reference leg for receiving the second reference mirror signal and configured for generating the complement output signal from the second reference mirror signal.

36. The dual output comparator of claim 35 wherein the second mirror reference leg comprises a second diode connected MOS transistor of the second conductivity type with its gates and drains commonly connected the difference circuit to the drains of the second transistor of the pair of transistors of the differential amplifier and its source is connected to a supply voltage source.

37. The dual output comparator of claim 36 wherein the at least one second mirror leg comprises a second MOS transistor of the second conductivity type having a gate connected to the commonly connected gate and drain of the second diode connected MOS transistor, its source connected to the supply voltage source, and a drain.

38. The dual output comparator of claim 34 wherein the first mirror reference leg comprises a first diode connected MOS transistor of a second conductivity type with its gate and drain commonly connected for receiving the true output signal from the difference circuit and its source is connected to a supply voltage source.

39. The dual output comparator of claim 38 wherein the second mirror leg comprises a first MOS transistor of the second conductivity type having a gate connected to the commonly connected gate and drain of the first diode connected MOS transistor, its source connected to the supply voltage source, and a drain.

40. The dual output comparator of claim 33 wherein the transfer mirror circuit comprises:

a transfer mirror reference leg connected to the first mirror driver for receiving the mirrored true output signal of the first mirror circuit configured for generating a reference mirrored true output signal;

a transfer mirror leg connected to the transfer mirror reference leg for receiving the reference mirrored true output signal and configured for generating a second mirrored true reference signal to be transferred to the complement mirror leg to be combined with the mirrored complement output signal to determine the digital state at the output terminals indicating that the magnitude of the first input signal is greater than or lesser than the second input signal.

41. The dual output comparator of claim 40 wherein one offset generator is connected in parallel with the associated second mirror leg to inject or extract the threshold offset voltage level to accurately offset the primary reference threshold value by an offset threshold value to insure that the first signal is greater than or less than the second input signal as offset by the threshold offset voltage level.

42. The dual output comparator of claim 40 wherein one offset generator is connected in parallel with the transfer mirror leg to inject or extract the threshold offset voltage level to accurately offset the primary reference threshold value by an offset threshold value to insure that the first signal is greater than or less than the second input signal as offset by the threshold offset voltage level.

43. The dual output comparator of claim 40 wherein the transfer mirror reference leg comprises a diode connected MOS transistor of the first conductivity type having a gate and drain commonly connected to receive the mirrored true output signal and a source connected to a reference voltage source.

44. The dual output comparator of claim 43 wherein the transfer mirror leg comprises a MOS transistor of the first conductivity type having a gate connected to the commonly connected gate and drain of the diode connected MOS transistor of the first conductivity type, a drain connected to the associated second mirror driver to be combined with the mirrored complement output signal, and source connected to the reference voltage source.

45. The dual output comparator of claim 33 wherein the offset generator comprises a current source that injects or extracts a current from the first mirror driver or the second mirror driver to generate the threshold adjustment signal level to accurately offset the second input signal.

46. The dual output comparator of claim 45 wherein the offset generator further comprises a selection switch in series with the current source such that a plurality of offset generators are connected to the first mirror driver or the second mirror driver to selectively adjust the current injected or extracted from the first mirror driver or the second mirror driver to program the threshold offset voltage level.

47. The dual output comparator of claim 32 wherein the difference circuit comprises:
a pair of transistors of a first conductivity type connected as a differential amplifier where the first input signal is provided to a gate of a first transistor of the pair of transistors and the second input signal is provided to the gate of a second transistor of the pair of transistors;
a biasing source including a first terminal connected to commonly connected sources of the pair of transistors and a second terminal connected to a reference voltage source, wherein drains of the pair of transistors are connected to form a first output terminal and a second output terminal of the difference circuit and are connected as the inputs to the output mirror driver circuit.

48. A buck DC-to-DC converter comprising:
a dual output comparator configured to compare a feedback signal from an output terminal of the buck DC-to-DC converter with a reference voltage level and a voltage level of the reference voltage level as offset by a threshold offset signal level comprising:
a difference circuit configured to receive the feedback signal and the reference voltage level to determine when a magnitude of the feedback signal is greater than or lesser than the reference voltage level and configured to provide a true output signal and a complement output signal that are indicative that magnitude of the feedback signal is greater than or lesser than the reference voltage level; and
an output mirror driver circuit in communication with the difference circuit for receiving the true output signal and the complement output signal comprising:
a sleep mirror driver circuit configured for receiving the true output signal from the difference circuit and configured for generating sleep mirrored true output signal indicating that the feedback signal is greater than or lesser than the reference voltage level,
an panic mirror driver circuit configured for receiving the complement output signal from the difference circuit and configured for generating a panic mirrored complement output signal indicating that the feedback signal is greater than or lesser than the reference voltage level as offset by the threshold offset voltage level, and
a panic offset generator connected to the panic mirror circuit for receiving the panic mirrored complement output signal and configured for accurately generating the threshold offset voltage level to ensure that the feedback signal is greater than or lesser than the reference level signal as offset by the threshold offset voltage level.

49. The buck DC-to-DC converter of claim 48 wherein the output mirror circuit further comprises:
a transfer mirror circuit in communication with the sleep mirror driver for receiving the sleep mirrored true output signal and configured for generating a mirrored in-phase reference signal for transfer to the panic mirror driver to be combined with the panic mirrored complement output signal to determine that the feedback signal is greater than or lesser than the reference level signal and the feedback signal is greater than or lesser than the reference level signal as offset by the threshold offset voltage level wherein a first digital output signal indicates the digital state signifying whether the feedback signal is greater than or lesser than the reference voltage level and a second digital output signal indicates the digital state signifying whether the feedback signal is greater than or lesser than the reference voltage level as adjusted by the threshold offset voltage level.

50. The buck DC-to-DC converter of claim 49 wherein the sleep mirror driver comprises:
a first mirror reference leg in communication with the difference circuit for receiving the true output signal and configured for generating a sleep reference mirror signal; and
a first mirror leg connected to the first mirror reference leg t for generating the true comparison result signals.

51. The buck DC-to-DC converter of claim 50 wherein the panic mirror driver comprises:
a second mirror reference leg in communication with the difference circuit for receiving the complement output signal and configured for generating a panic reference mirror signal; and
a second mirror leg connected to the second mirror reference leg for receiving the panic reference mirror signal and configured for generating the complement output signal from the panic reference mirror signal.

52. The buck DC-to-DC converter of claim 51 wherein the second mirror reference leg comprises a second diode connected MOS transistor of the second conductivity type with its gates and drains commonly connected through the complement output terminals of the difference circuit to the drains of the second transistor of the pair of transistors of the differential amplifier and its source is connected to a supply voltage source.

53. The buck DC-to-DC converter of claim 52 wherein the second mirror leg comprises a second MOS transistor of the second conductivity type having a gate connected to the commonly connected gate and drain of the second diode connected MOS transistor, its source connected to the supply voltage source, and a drain.

54. The buck DC-to-DC converter of claim 50 wherein the first mirror reference leg comprises a first diode connected MOS transistor of a second conductivity type with its gate and drain commonly connected for receiving the true output signal from the difference circuit and its source is connected, to a supply voltage source.

55. The buck DC-to-DC converter of claim 54 wherein the second mirror leg comprises a first MOS transistor of the second conductivity type having a gate connected to the commonly connected gate and drain of the first diode connected MOS transistor, its source connected to the supply voltage source, and a drain.

56. The buck DC-to-DC converter of claim 49 wherein the transfer mirror circuit comprises:
- a transfer mirror reference leg connected to the sleep mirror driver circuit to receive the mirrored true output signal of the sleep mirror driver circuit to generate a reference mirrored true output signal;
- a transfer mirror leg connected to the transfer mirror reference leg for receiving the reference mirrored true output signal and configured for generating a second mirrored true output signal to be transferred to the panic mirror driver circuit to be combined with the mirrored complement output signal to determine the digital state at the output terminals indicating that the magnitude of the feedback signal is greater than or lesser than the reference level signal.

57. The buck DC-to-DC converter of claim 56 wherein the offset generator is connected in parallel with the associated panic mirror driver to inject or extract the threshold adjustment signal level to accurately offset the reference level signal by an offset threshold value to ensure that the feedback signal is greater than or lesser than the reference level signal as offset by the threshold offset voltage level.

58. The buck DC-to-DC converter of claim 56 wherein the offset generator is connected in parallel with the transfer mirror leg to inject or extract the threshold adjustment signal level to accurately offset the reference level signal by an offset threshold value to insure that the feedback signal is greater than or less than the reference level signal as offset by the threshold offset voltage level.

59. The buck DC-to-DC converter of claim 58 wherein the offset generator comprises a current source that injects or extracts a current from the sleep mirror driver or the panic mirror driver to generate the threshold offset voltage to accurately offset the reference threshold value by the offset threshold voltage.

60. The buck DC-to-DC converter of claim 59 wherein the offset generator further comprises a selection switch in series with the current source such that a plurality of offset generators are connected to the sleep mirror driver or the panic mirror driver to selectively adjust the current injected or extracted from the sleep mirror driver or the panic mirror driver to program the threshold offset voltage level.

61. The buck DC-to-DC converter of claim 56 wherein the transfer mirror reference leg comprises a diode connected MOS transistor of the first conductivity type having a gate and drain commonly connected to receive the mirrored true output signal and a source connected to a reference voltage source.

62. The buck DC-to-DC converter of claim 61 wherein the transfer mirror leg comprises a MOS transistor of the first conductivity type having a gate connected to the commonly connected gate and drain of the diode connected MOS transistor of the first conductivity type, a drain connected to the panic mirror driver to be combined with the mirrored complement output signal, and source connected to the reference voltage source.

63. The buck DC-to-DC converter of claim 48 wherein the difference circuit comprises:
- a pair of transistors of a first conductivity type connected as a differential amplifier where the feedback signal is provided to a gate of a first transistor of the pair of transistors and the reference level signal is provided to the gate of a second transistor of the pair of transistors;
- a biasing source including a first terminal connected to commonly connected sources of the pair of transistors and a second terminal connected to a reference voltage source, wherein drains of the pair of transistors are connected to form the true output terminal and the complement output terminal of the difference circuit and are connected as the inputs to the output mirror driver circuit.

\* \* \* \* \*